(12) United States Patent
Gillaspie et al.

(10) Patent No.: US 10,156,762 B2
(45) Date of Patent: *Dec. 18, 2018

(54) COUNTER ELECTRODE FOR ELECTROCHROMIC DEVICES

(71) Applicant: View, Inc., Milpitas, CA (US)

(72) Inventors: Dane Gillaspie, Fremont, CA (US); Sridhar K. Kailasam, Fremont, CA (US); Robert T. Rozbicki, Germantown, TN (US)

(73) Assignee: View, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/527,194

(22) PCT Filed: Nov. 20, 2015

(86) PCT No.: PCT/US2015/061995
§ 371 (c)(1),
(2) Date: May 16, 2017

(87) PCT Pub. No.: WO2016/085823
PCT Pub. Date: Jun. 2, 2016

(65) Prior Publication Data
US 2017/0371221 A1    Dec. 28, 2017

Related U.S. Application Data

(63) Continuation-in-part of application No. 15/214,340, filed on Jul. 19, 2016, now Pat. No. 9,904,138, which
(Continued)

(51) Int. Cl.
*G02F 1/15* (2006.01)
*G02F 1/03* (2006.01)
(Continued)

(52) U.S. Cl.
CPC .......... *G02F 1/1525* (2013.01); *B23K 20/10* (2013.01); *C03C 17/3417* (2013.01);
(Continued)

(58) Field of Classification Search
CPC .......... G02F 1/167; G02F 1/0316; G02F 3/16; G02F 1/163; G02F 1/155; G02F 1/1523;
(Continued)

(56) References Cited

U.S. PATENT DOCUMENTS 4,009,935 A   3/1977   Faughnan et al.
4,264,150 A   4/1981   Yano et al.
(Continued)

FOREIGN PATENT DOCUMENTS

CN    1492274 A    4/2004
CN    1688923 A    10/2005
(Continued)

OTHER PUBLICATIONS

International Search Report and Written Opinion dated Aug. 26, 2015 in PCT/US15/28067.
(Continued)

*Primary Examiner* — Dawayne A Pinkney
(74) *Attorney, Agent, or Firm* — Weaver Austin Villeneuve & Sampson LLP; Brian D. Griedel

(57) ABSTRACT

The embodiments herein relate to electrochromic stacks, electrochromic devices, and methods and apparatus for making such stacks and devices. In various embodiments, an anodically coloring layer in an electrochromic stack or device is fabricated to include nickel tungsten tantalum oxide (NiWTaO). This material is particularly beneficial in that it is very transparent in its clear state.

22 Claims, 18 Drawing Sheets

Related U.S. Application Data is a continuation of application No. 13/610,716, filed on Sep. 11, 2012, now Pat. No. 9,429,809, which is a continuation of application No. 12/645,111, filed on Dec. 22, 2009, now Pat. No. 9,664,974.

(60) Provisional application No. 62/085,096, filed on Nov. 26, 2014, provisional application No. 62/192,443, filed on Jul. 14, 2015, provisional application No. 61/165,484, filed on Mar. 31, 2009.

(51) Int. Cl.
| | | |
|---|---|---|
| *G02B 26/00* | (2006.01) | |
| *G02F 1/133* | (2006.01) | |
| *G09G 3/38* | (2006.01) | |
| *B23K 20/10* | (2006.01) | |
| *C03C 17/34* | (2006.01) | |
| *C23C 10/28* | (2006.01) | |
| *C23C 14/08* | (2006.01) | |
| *C23C 14/18* | (2006.01) | |
| *C23C 14/34* | (2006.01) | |
| *C23C 14/58* | (2006.01) | |
| *G02F 1/1343* | (2006.01) | |
| *G02F 1/155* | (2006.01) | |

(52) U.S. Cl.
CPC ............ *C23C 10/28* (2013.01); *C23C 14/083* (2013.01); *C23C 14/085* (2013.01); *C23C 14/185* (2013.01); *C23C 14/3407* (2013.01); *C23C 14/5806* (2013.01); *C23C 14/5853* (2013.01); *G02F 1/13439* (2013.01); *G02F 1/155* (2013.01); *G02F 1/1523* (2013.01); *C03C 2217/94* (2013.01); *G02F 2001/1502* (2013.01); *G02F 2001/1555* (2013.01)

(58) Field of Classification Search
CPC ...... G02F 1/1525; G02F 1/1521; G02F 1/133; G02F 1/061; G02F 2001/1678; G02F 1/1533; G02F 1/03; G02B 26/00; G02B 26/08; G02B 26/26; C09K 9/02; B60R 1/088; H04N 9/3137; H04N 9/22
USPC ........ 359/296, 253–254, 245–247, 290–291, 359/298, 265–275, 277, 242; 349/33; 345/49, 105, 107; 430/31–32
See application file for complete search history.

(56) References Cited

U.S. PATENT DOCUMENTS

| | | | |
|---|---|---|---|
| 4,293,194 A | 10/1981 | Takahashi | |
| 4,297,006 A | 10/1981 | Bissar | |
| 4,396,253 A | 8/1983 | Kuwagaki et al. | |
| 4,482,216 A | 11/1984 | Hashimoto | |
| 4,561,729 A | 12/1985 | Heinz et al. | |
| 4,832,463 A | 5/1989 | Goldner et al. | |
| 4,923,289 A | 5/1990 | Demiryont | |
| 4,938,571 A | 7/1990 | Cogan et al. | |
| 5,019,420 A | 5/1991 | Rauh | |
| 5,124,832 A | 6/1992 | Greenberg et al. | |
| 5,138,481 A | 8/1992 | Demiryont | |
| 5,142,406 A | 8/1992 | Lampert et al. | |
| 5,216,536 A | 6/1993 | Agrawal et al. | |
| 5,657,150 A | 8/1997 | Kallman et al. | |
| 5,659,417 A | 8/1997 | Van Dine et al. | |
| 5,666,771 A | 9/1997 | Macquart et al. | |
| 5,699,192 A | 12/1997 | Van Dine et al. | |
| 5,724,175 A | 3/1998 | Hichwa et al. | |
| 5,724,177 A | 3/1998 | Ellis, Jr. et al. | |
| 5,754,329 A | 5/1998 | Coleman | |
| 5,757,537 A | 5/1998 | Ellis, Jr. et al. | |
| 5,814,195 A | 9/1998 | Lehan et al. | |
| 5,847,858 A | 12/1998 | Krings et al. | |
| 5,859,723 A | 1/1999 | Jodicke et al. | |
| 6,178,034 B1 | 1/2001 | Allemand | |
| 6,185,034 B1 | 2/2001 | Nakamura et al. | |
| 6,211,995 B1 | 4/2001 | Azens et al. | |
| 6,266,177 B1 | 7/2001 | Allemand et al. | |
| 6,277,523 B1 | 8/2001 | Giron | |
| 6,337,758 B1 | 1/2002 | Beteille et al. | |
| 6,515,787 B1 | 2/2003 | Westfall et al. | |
| 6,529,308 B2 | 3/2003 | Beteille et al. | |
| 6,559,411 B2 | 5/2003 | Borgeson et al. | |
| 6,791,737 B2 | 9/2004 | Giron | |
| 6,822,778 B2 | 11/2004 | Westfall et al. | |
| 6,856,444 B2 | 2/2005 | Ingalls et al. | |
| 6,859,297 B2 | 2/2005 | Lee et al. | |
| 6,919,530 B2 | 7/2005 | Borgeson et al. | |
| 6,940,628 B2 | 9/2005 | Giron | |
| 7,099,062 B2 | 8/2006 | Azens et al. | |
| 7,193,763 B2 | 3/2007 | Beteille et al. | |
| 7,230,748 B2 | 6/2007 | Giron et al. | |
| 7,265,891 B1 | 9/2007 | Demiryont | |
| 7,277,215 B2 | 10/2007 | Greer | |
| 7,372,610 B2 | 5/2008 | Burdis et al. | |
| 7,531,101 B2 | 5/2009 | Beteille | |
| 7,564,611 B2 | 7/2009 | Jang et al. | |
| 7,593,154 B2 | 9/2009 | Burdis et al. | |
| 7,604,717 B2 | 10/2009 | Beteille et al. | |
| 7,646,526 B1 | 1/2010 | Wang et al. | |
| 7,704,555 B2 | 4/2010 | Demiryont | |
| 7,830,585 B2 | 11/2010 | Widjaja et al. | |
| 7,869,114 B2 | 1/2011 | Valentin et al. | |
| 7,894,120 B2 | 2/2011 | Valentin et al. | |
| 8,004,744 B2 | 8/2011 | Burdis et al. | |
| 8,031,389 B2 | 10/2011 | Wang et al. | |
| 8,168,265 B2 | 5/2012 | Kwak et al. | |
| 8,228,592 B2 | 7/2012 | Wang et al. | |
| 8,300,298 B2 | 10/2012 | Wang et al. | |
| 8,432,603 B2 | 4/2013 | Wang et al. | |
| 8,638,487 B2 | 1/2014 | Veerasamy | |
| 8,687,261 B2 | 4/2014 | Gillaspie et al. | |
| 8,749,868 B2 | 6/2014 | Wang et al. | |
| 8,758,575 B2 | 6/2014 | Wang et al. | |
| 8,764,950 B2 | 7/2014 | Wang et al. | |
| 8,764,951 B2 | 7/2014 | Wang et al. | |
| 8,773,747 B2 | 7/2014 | Ferreira et al. | |
| 9,007,674 B2 | 4/2015 | Kailasam et al. | |
| 9,116,409 B1 | 8/2015 | Sun et al. | |
| 9,140,951 B2 | 9/2015 | Wang et al. | |
| 9,164,346 B2 | 10/2015 | Wang et al. | |
| 9,261,751 B2 | 2/2016 | Pradhan et al. | |
| 9,334,557 B2 | 5/2016 | Neudecker et al. | |
| 9,454,053 B2 | 9/2016 | Strong et al. | |
| 9,664,974 B2 | 5/2017 | Kozlowski et al. | |
| 9,671,664 B2 | 6/2017 | Pradhan et al. | |
| 9,759,975 B2 | 9/2017 | Wang et al. | |
| 10,054,833 B2 | 8/2018 | Kailasam et al. | |
| 2003/0010957 A1 | 1/2003 | Haering et al. | |
| 2003/0156313 A1 | 8/2003 | Serra et al. | |
| 2004/0150867 A1 | 8/2004 | Lee et al. | |
| 2005/0147825 A1 | 7/2005 | Arnaud et al. | |
| 2005/0259310 A1 | 11/2005 | Giri et al. | |
| 2006/0209383 A1* | 9/2006 | Burdis ................. G02F 1/1523 359/265 |
| 2007/0008605 A1 | 1/2007 | Garg et al. | |
| 2007/0097481 A1 | 5/2007 | Burdis et al. | |
| 2008/0304130 A1 | 12/2008 | Nguyen | |
| 2009/0057137 A1 | 3/2009 | Pitts et al. | |
| 2009/0285978 A1 | 11/2009 | Burdis et al. | |
| 2009/0304912 A1 | 12/2009 | Kwak et al. | |
| 2009/0323156 A1 | 12/2009 | Shin et al. | |
| 2010/0007937 A1 | 1/2010 | Widjaja et al. | |
| 2010/0103496 A1 | 4/2010 | Schwendeman et al. | |
| 2010/0165440 A1 | 7/2010 | Nguyen et al. | |
| 2010/0243427 A1 | 9/2010 | Kozlowski et al. | |
| 2010/0245973 A1* | 9/2010 | Wang ................. C03C 17/3417 359/275 |
| 2011/0043885 A1 | 2/2011 | Lamine et al. | |
| 2011/0043886 A1 | 2/2011 | Jeon et al. | |
| 2011/0151283 A1 | 6/2011 | Gillaspie et al. | |

(56) References Cited

U.S. PATENT DOCUMENTS

| | | |
|---|---|---|
| 2011/0211247 A1 | 9/2011 | Kozlowski et al. |
| 2011/0249314 A1 | 10/2011 | Wang et al. |
| 2011/0266137 A1 | 11/2011 | Wang et al. |
| 2011/0266138 A1 | 11/2011 | Wang et al. |
| 2011/0267674 A1 | 11/2011 | Wang et al. |
| 2011/0267675 A1 | 11/2011 | Wang et al. |
| 2011/0297535 A1 | 12/2011 | Higdon et al. |
| 2011/0299149 A1 | 12/2011 | Park et al. |
| 2012/0181167 A1 | 7/2012 | Jiang et al. |
| 2012/0275008 A1 | 11/2012 | Pradhan et al. |
| 2012/0276734 A1 | 11/2012 | van Mol et al. |
| 2013/0003157 A1 | 1/2013 | Wang et al. |
| 2013/0016417 A1 | 1/2013 | Veerasamy |
| 2013/0101751 A1 | 4/2013 | Berland et al. |
| 2013/0182307 A1 | 7/2013 | Gillaspie et al. |
| 2013/0270105 A1 | 10/2013 | Wang et al. |
| 2013/0286459 A1 | 10/2013 | Burdis et al. |
| 2014/0177027 A1 | 6/2014 | Wang et al. |
| 2014/0204444 A1 | 7/2014 | Choi et al. |
| 2014/0204445 A1 | 7/2014 | Choi et al. |
| 2014/0204446 A1 | 7/2014 | Choi et al. |
| 2014/0204447 A1 | 7/2014 | Choi et al. |
| 2014/0204448 A1 | 7/2014 | Bergh et al. |
| 2014/0205746 A1 | 7/2014 | Choi et al. |
| 2014/0205748 A1 | 7/2014 | Choi et al. |
| 2014/0313561 A1 | 10/2014 | Wang et al. |
| 2015/0131140 A1 | 5/2015 | Kailasam et al. |
| 2015/0362763 A1 | 12/2015 | Wheeler et al. |
| 2015/0370139 A1 | 12/2015 | Wang et al. |
| 2016/0011480 A1 | 1/2016 | Pradhan et al. |
| 2016/0026055 A1 | 1/2016 | Choi et al. |
| 2016/0209722 A1 | 7/2016 | Wang et al. |
| 2017/0003564 A1 | 1/2017 | Gillaspie et al. |
| 2017/0097552 A1 | 4/2017 | Pradhan et al. |
| 2017/0176832 A1 | 6/2017 | Pradhan et al. |
| 2017/0184937 A1 | 6/2017 | Wang et al. |
| 2017/0255076 A1 | 9/2017 | Gillaspie et al. |
| 2017/0357135 A1 | 12/2017 | Gillaspie et al. |
| 2018/0231858 A1 | 8/2018 | Kailasam et al. |

FOREIGN PATENT DOCUMENTS

| | | |
|---|---|---|
| EP | 0497616 A2 | 5/1992 |
| EP | 1918412 A1 | 5/2008 |
| JP | S57-81242 A | 5/1982 |
| JP | S58-33223 A | 2/1983 |
| JP | S58-139128 A | 8/1983 |
| JP | S58-163921 A | 9/1983 |
| JP | S59-040625 A | 3/1984 |
| JP | S60-202429 A | 10/1985 |
| JP | H03-500096 A | 1/1991 |
| JP | H10-501847 A | 2/1998 |
| JP | 2006-235632 A | 9/2006 |
| JP | 2008-026605 A | 2/2008 |
| JP | 2010-509720 A | 3/2010 |
| JP | 2012-523018 A | 9/2012 |
| JP | 2013-525860 A | 6/2013 |
| KR | 10-2008-0051280 | 6/2008 |
| KR | 10-2014-0068026 A | 6/2014 |
| TW | 200417280 A | 9/2004 |
| WO | WO98/47613 A1 | 10/1998 |
| WO | WO2004/087985 A2 | 10/2004 |
| WO | WO2008/055824 | 5/2008 |
| WO | WO2008/154517 A2 | 12/2008 |
| WO | WO2009/148861 | 12/2009 |
| WO | WO2010/120537 A2 | 10/2010 |
| WO | WO2010/147494 A1 | 12/2010 |
| WO | WO2012/138281 | 10/2012 |
| WO | WO2014/025876 A2 | 2/2014 |
| WO | WO2014/113795 A1 | 7/2014 |
| WO | WO2014/113796 A1 | 7/2014 |
| WO | WO2014/113801 A1 | 7/2014 |
| WO | WO2014/200927 A1 | 12/2014 |
| WO | WO2015/168166 A1 | 11/2015 |
| WO | WO2015/168626 A1 | 11/2015 |
| WO | WO2016/036707 A2 | 3/2016 |
| WO | WO2016/085764 A1 | 6/2016 |
| WO | WO2016/085823 A1 | 6/2016 |

OTHER PUBLICATIONS

International Preliminary Report on Patentability dated Nov. 17, 2016 in PCT/US15/28067.
International Search Report and Written Opinion dated Mar. 18, 2016 in PCT/US15/47891.
International Preliminary Report on Patentability dated Mar. 16, 2017 in PCT/US15/47891.
International Search Report and Written Opinion dated Mar. 7, 2016 in PCT/US15/61995.
International Search Report and Written Opinion dated Feb. 29, 2016 in PCT/US15/61668.
International Search Report and Written Opinion dated Oct. 18, 2016 in PCT/US16/41375.
Avendano, E. et al., "Electrochromic Nickel-Oxide-Based Films with Minimized Bleached-State Absorptance," I 203rd Meeting of the Electrochemical Society, Electrochemical Society Proceedings vol. 2003-17, 2003, pp. 80-90.
Hutchins, M.G. et al, "The electrochromic behavior of tin-nickel oxide," Solar Energy Materials and Solar Cells, vol. 54, 1998, pp. 75-84.
Green, Sara, "Electrochromic nickel-tungsten oxides: optical, electrochemical and structural characterization of sputter-deposited thin films in the whole composition range," Dissertation, Digital Comprehensive Summaries of Uppsala Dissertations from the Faculty of Science and Technology 963, Uppsala University, Sweden, 2012.
Arvizu, M.A. et al., "Electrochromic $W1-x-yTi_xMo_yO3$ thin films made by sputter deposition: Large optical modulation, good cycling durability, and approximate color neutrality," Chemistry of Materials [online, just accepted manuscript], Feb. 23, 2017, [retrieved on Feb. 24, 2017]. Retrieved from the internet: <http://pubs.acs.org> <DOI: 10.1021/acs.chemmater.6b05198>.
U.S. Appl. No. 15/507,734, filed Feb. 28, 2017, Gillaspie et al.
Preliminary Amendment filed Feb. 28, 2017 in U.S. Appl. No. 15/507,734.
U.S. Office Action dated Dec. 30, 2016 in U.S. Appl. No. 15/004,794.
U.S. Notice of Allowance dated Apr. 12, 2017 in U.S. Appl. No. 15/004,794.
International Search Report and Written Opinion dated Jul. 16, 2015 in PCT/US15/028899.
International Preliminary Report on Patentability dated Nov. 17, 2016 in PCT/US15/028899.
International Preliminary Report on Patentability dated Jun. 8, 2017 in PCT/US15/61995.
International Preliminary Report on Patentability dated Jun. 8, 2017 in PCT/US15/61668.
U.S. Appl. No. 15/340,853, filed Nov. 1, 2016, Pradhan et al.
U.S. Appl. No. 15/612,928, filed Jun. 2, 2017, Wang et al.
U.S. Appl. No. 15/587,114, filed May 4, 2017, Kailasam et al.
U.S. Appl. No. 15/526,969, filed May 15, 2017, Gillaspie et al.
Preliminary Amendment filed Jun. 6, 2017 for U.S. Appl. No. 15/612,928.
Preliminary Amendment filed May 5, 2017 for U.S. Appl. No. 15/587,114.
Preliminary Amendment filed May 15, 2017 for U.S. Appl. No. 15/526,969.
U.S. Notice of Allowance, dated Sep. 18, 2012, issued in U.S. Appl. No. 12/772,055.
U.S. Office Action, dated Apr. 26, 2012, issued in U.S. Appl. No. 12/772,055.
U.S. Notice of Allowance dated Dec. 4, 2017 for U.S. Appl. No. 15/587,114.
U.S. Notice of Allowance dated Mar. 26, 2018 for U.S. Appl. No. 15/587,114.
U.S. Office Action dated Sep. 11, 2017 for U.S. Appl. No. 15/587,114.
U.S. Notice of Allowance dated Jul. 10, 2013 in U.S. Appl. No. 12/772,075.

(56) References Cited

OTHER PUBLICATIONS

U.S. Office Action dated Aug. 16, 2012 issued in U.S. Appl. No. 12/772,075.
U.S. Office Action dated Dec. 26, 2012 in U.S. Appl. No. 12/772,075.
U.S. Office Action dated Jan. 20, 2012 issued in U.S. Appl. No. 12/772,075.
U.S. Notice of Allowance dated Jan. 21, 2014 in U.S. Appl. No. 13/610,684.
U.S. Office Action dated Jun. 25, 2013 in U.S. Appl. No. 13/610,684.
U.S. Notice of Allowance dated Jan. 22, 2015 in U.S. Appl. No. 14/052,455.
U.S. Notice of Allowance dated May 11, 2015 in U.S. Appl. No. 14/052,455.
U.S. Office Action dated Aug. 6, 2014 in U.S. Appl. No. 14/052,455.
U.S. Notice of Allowance dated Aug. 4, 2015 in U.S. Appl. No. 14/209,993.
U.S. Notice of Allowance dated May 28, 2015 in U.S. Appl. No. 14/209,993.
U.S. Notice of Allowance dated Jan. 11, 2017 in U.S. Appl. No. 14/841,511.
U.S. Notice of Allowance dated May 22, 2018 in U.S. Appl. No. 15/457,609.
U.S. Office Action dated Jul. 28, 2016 in U.S. Appl. No. 14/841,511.
U.S. Notice of Allowance dated May 31, 2012 issued in U.S. Appl. No. 13/166,537.
U.S. Office Action dated Feb. 16, 2012 issued in U.S. Appl. No. 13/166,537.
U.S. Office Action dated Oct. 25, 2011 issued in U.S. Appl. No. 13/166,537.
U.S. Notice of Allowance dated Feb. 14, 2014 for U.S. Appl. No. 13/627,798.
U.S. Final Office Action dated Jun. 27, 2013 in U.S. Appl. No. 12/814,277.
U.S. Notice of Allowance dated Mar. 12, 2014 in U.S. Appl. No. 12/814,277.
U.S. Office Action dated Nov. 20, 2012 in U.S. Appl. No. 12/814,277.
U.S. Final Office Action dated Jun. 27, 2013 in U.S. Appl. No. 12/814,279.
U.S. Notice of Allowance dated Mar. 17, 2014 in U.S. Appl. No. 12/814,279.
U.S. Office Action dated Nov. 20, 2012 in U.S. Appl. No. 12/814,279.
U.S. Final Office Action dated Jul. 23, 2015 in U.S. Appl. No. 13/462,725.
U.S. Notice of Allowance dated Nov. 25, 2015 in U.S. Appl. No. 13/462,725.
U.S. Office Action dated Jan. 14, 2015 in U.S. Appl. No. 13/462,725.
U.S. Notice of Allowance (corrected) dated Feb. 27, 2017 in U.S. Appl. No. 14/683,541.
U.S. Notice of Allowance dated Jan. 27, 2017 in U.S. Appl. No. 14/683,541.
U.S. Office Action dated Aug. 12, 2016 in U.S. Appl. No. 14/683,541.
U.S. Office Action dated Apr. 5, 2018 in U.S. Appl. No. 15/441,130.
U.S. Notice of Allowance dated Aug. 9, 2017 in U.S. Appl. No. 15/004,794.
U.S. Office Action dated Jun. 27, 2018 in U.S. Appl. No. 15/612,928.
U.S. Office Action dated Dec. 20, 2016 in U.S. Appl. No. 15/004,794.
U.S. Office Action dated May 15, 2018 for U.S. Appl. No. 15/507,734.
U.S. Office Action dated May 25, 2018 for U.S. Appl. No. 15/526,969.
Australian Examination Report dated Apr. 19, 2016 in AU Application No. 2014210572.
Australian Examination Report dated Jan. 6, 2014 in AU Application No. 2011245431.
Australian Examination Report dated Jun. 7, 2018 in AU Application No. 2017202249.
Chinese Office Action dated Aug. 31, 2015 in CN Application No. CN201180027892.9.
Chinese Office Action dated Jan. 8, 2015 in CN Application No. CN201180027892.9.
Chinese Office Action dated Jun. 15, 2017 in CN Application No. 201380031908.2.
Chinese Office Action dated Mar. 31, 2016 in CN Application No. CN201180027892.9.
Chinese Office Action dated Sep. 28, 2016 in CN Application No. 201380031908.2.
European Office Action dated Feb. 10, 2017 in EP Application No. 11775488.7.
European Office Action dated Oct. 16, 2017 in EP Application No. 11775488.7.
European Search Report (Extended) dated Apr. 6, 2016 in EP Application No. 13785049.1.
European Search Report (Extended) dated Dec. 1, 2017 in EP Application No. 15785891.1.
European Search Report (Extended) dated Jan. 29, 2018 in EP Application No. 15837472.8.
European Search Report (Extended) dated May 2, 2018 in EP Application No. 15862207.6.
European Search Report (Extended) dated May 24, 2018 in EP Application No. 15863517.7.
European Search Report (Extended) dated Nov. 28, 2017 in EP Application No. 15785437.3.
European Search Report (Partial Supplementary) dated Jan. 8, 2016 in EP Application No. 13785049.1.
European Search Report dated May 13, 2014 in EP Application No. 11775488.7.
Indian Office Action dated Jun. 19, 2018 in IN Application No. 3663/KOLNP/2012.
International Preliminary Report on Patentability dated Nov. 15, 2012 in PCT/US2011/033906.
International Search Report and Written Opinion dated Sep. 14, 2011, issued in PCT/US2011/033906.
International Preliminary Report on Patentability, dated Nov. 15, 2012 in PCT/US2011/033822.
International Search Report and Written Opinion dated Jul. 7, 2011, issued in PCT/US2011/033822.
International Preliminary Report on Patentability dated Nov. 13, 2014 in PCT/US2013/038481.
International Search Report and Written Opinion dated Aug. 14, 2013 in PCT/US2013/038481.
International Search Report and Written Opinion (ISA/KR) dated Jul. 7, 2017 in PCT/US17/24120.
International Preliminary Report on Patentability dated Jan. 25, 2018 in PCT/US16/41375.
Japanese Office Action dated Jan. 6, 2015 in JP Application No. JP2013-508130.
Japanese Office Action dated Mar. 8, 2016 in JP Application No. JP2015-118553.
Japanese Office Action dated Nov. 21, 2017 in JP Application No. JP2016-215029.
Korean Office Action dated Feb. 28, 2017 in KR Application No. 10-2012-7031407.
Korean Office Action dated Feb. 8, 2018 in KR Application No. 10-2018-7002491.
Mexican Office Action dated Jun. 6, 2013 in MX Application No. MX/a/2012/012573.
Preliminary Amendment filed Jun. 6, 2016 for U.S. Appl. No. 14/841,511.
Russian Office Action dated Feb. 25, 2015 in RU Application No. 2012151304.
Singapore Examination Report dated Nov. 5, 2013 in SG Application No. 201208018-0.
Taiwanese Decision of Rejection dated Nov. 29, 2016 in TW Application No. 104144317.
Taiwanese Decision of Rejection dated Feb. 24, 2017 in TW Application No. 100115201.
Taiwanese Office Action dated Jul. 22, 2015 in TW Application No. 100115190.
Taiwanese Office Action dated Jun. 1, 2016 in TW Application No. 104144317.
Taiwanese Office Action dated May 26, 2016 in TW Application No. 100115201.
Burdis, et al., "Technology Advancements to Lower Costs of Electrochromic Window Glazings", SAGE Electronics, Inc., DE-PS26-06NT42764, Final Report, dated Apr. 2, 2010.

(56) References Cited

OTHER PUBLICATIONS

Hersh, H.N., "Mechanism of Electrochromism in WO3," Applied Physics Letters, vol. 27, No. 12, Dec. 15, 1975, pp. 646-648.
Velux SageGlass Flyer, 2007, 4 pages.
Vink, et al., "Lithium Trapping at Excess Oxygen in Sputter-Deposited a-WO3 Films", Japanese Journal of Applied Physics, vol. 8, No. 3, Feb. 1, 1999, pp. 1540-1544.
Yoshimura, et al., "Electrochromism in a Thin-Film Device Using $Li_2WO_4$ as an Li-Electrolyte", Japanese Journal of Applied Physics, vol. 22, No. 1, Jan. 1983, pp. 152-156.
U.S. Appl. No. 15/953,327, filed Apr. 13, 2018, Kailasam et al.
U.S. Office Action dated Jul. 10, 2018 for U.S. Appl. No. 15/953,327.
Chinese Office Action dated Aug. 28, 2018 in CN Application No. CN201610412630.9.
U.S. Office Action dated Sep. 20, 2018 for U.S. Appl. No. 15/340,853.
U.S. Notice of Allowance dated Sep. 25, 2018 for U.S. Appl. No. 15/507,734.
U.S. Notice of Allowance dated Oct. 18, 2018 for U.S. Appl. No. 15/526,969.
International Preliminary Report on Patentability dated Oct. 4, 2018 in PCT/US17/24120.
U.S. Appl. No. 16/088,024, filed Sep. 24, 2018, Pradhan et al.
U.S. Appl. No. 16/168,587, filed Oct. 23, 2018, Gillaspie et al.
Preliminary Amendment filed Sep. 24, 2018 for U.S. Appl. No. 16/088,024.

\* cited by examiner

| ENTRY LOAD LOCK 802 | EC LAYER STATION | IC LAYER STATION 806 | CE LAYER STATION | EXIT LOAD LOCK 804 |

| ENTRY LOAD LOCK 802 | EC LAYER STATION 806a | IC LAYER STATION 806b | CE LAYER STATION 806c | EXIT LOAD LOCK 804 |

| ENTRY LOAD LOCK 802 | EC LAYER STATION 806a | LITHIUM STATION 807a | IC LAYER STATION 806b | CE LAYER STATION 806c | LITHIUM STATION 807b | TCO LAYER STATION 808 | EXIT LOAD LOCK 804 |

| ENTRY LOAD LOCK 802 | EC LAYER STATION 806a | IC LAYER STATION 806b | CE LAYER STATION 806c | LITHIUM STATION 807 | TCO LAYER STATION 808 | EXIT LOAD LOCK 804 |

Direction of substrate travel

Oxygen Concentration in Sputtering Atmosphere (%)

COUNTER ELECTRODE FOR ELECTROCHROMIC DEVICES

CROSS-REFERENCE TO RELATED APPLICATIONS

This is an application under 35 U.S.C. 371, which claims priority to PCT Application No. PCT/US15/61995, filed Nov. 19, 2015, and titled "COUNTER ELECTRODE FOR ELECTROCHROMIC DEVICES," which claims benefit of priority to U.S. Provisional Application No. 62/085,096, filed Nov. 26, 2014, and titled "COUNTER ELECTRODE FOR ELECTROCHROMIC DEVICES," and to U.S. Provisional Application No. 62/192,443, filed Jul. 14, 2015, and titled "COUNTER ELECTRODE FOR ELECTROCHROMIC DEVICES," each of which is herein incorporated by reference in its entirety and for all purposes. This Application is also a continuation-in-part of U.S. application Ser. No. 15/214,340, filed on Jul. 19, 2016, and titled, "FABRICATION OF LOW DEFECTIVITY ELECTROCHROMIC DEVICES," which is a continuation of U.S. patent application Ser. No. 13/610,716 (issued as U.S. Pat. No. 9,429,809), filed on Sep. 11, 2012, and titled "FABRICATION OF LOW DEFECTIVITY ELECTROCHROMIC DEVICES," which is a continuation of U.S. patent application Ser. No. 12/645,111 (issued as U.S. Pat. No. 9,664,974), filed on Dec. 22, 2009, and titled "FABRICATION OF LOW DEFECTIVITY ELECTROCHROMIC DEVICES," which claims benefit of and priority to U.S. Provisional Patent Application No. 61/165,484, filed on Mar. 31, 2009 and titled "ALL-SOLID-STATE ELECTROCHROMIC DEVICE."

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. One well known electrochromic material, for example, is tungsten oxide ($WO_3$). Tungsten oxide is a cathodic electrochromic material in which a coloration transition, transparent to blue, occurs by electrochemical reduction. Anodic electrochromic materials are also known, e.g., nickel oxide (e.g. NiO).

Electrochromic materials may be incorporated into, for example, windows and mirrors. The color, transmittance, absorbance, and/or reflectance of such windows and mirrors may be changed by inducing a change in the electrochromic material. One well known application of electrochromic materials, for example, is electrochromic windows for buildings.

While electrochromism was discovered in the 1960's, electrochromic devices have historically suffered from various problems that have prevented the technology from realizing its full commercial potential. For example, electrochromic windows may use tungsten oxide and/or nickel oxide materials, but there is much room for improvement. Certain areas that can be improved include material stability over time, switching speed, and optical properties, e.g., tinted states are often too blue and transparent states are often too yellow.

SUMMARY

The embodiments herein relate to electrochromic materials, electrochromic stacks, electrochromic devices, as well as methods and apparatus for making such materials, stacks, and devices. In various embodiments, a counter electrode material includes a novel composition of materials including nickel, tungsten, tantalum, and oxygen.

In one aspect of the disclosed embodiments, a method of fabricating an electrochromic stack is provided, the method including: forming a cathodically coloring layer including a cathodically coloring electrochromic material; and forming an anodically coloring layer including nickel tungsten tantalum oxide (NiWTaO). The NiWTaO material may meet have a particular composition. For example, in some cases, the NiWTaO has an atomic ratio of Ni:(W+Ta) that is between about 1.5:1 and 3:1, or between about 1.5:1 and 2.5:1, or between about 1.8:1 and 2.5:1, or between about 2:1 and 2.5:1, or between about 2:1 and 3:1. In these or other cases, the NiWTaO may have an atomic ratio of W:Ta that is between about 0.1:1 and 6:1, or between about 0.2:1 and 5:1, or between about 0.2:1 and 1:1, or between about 1:1 and 2:1.

The anodically coloring layer may be formed by sputtering one or more sputter targets to form the NiWTaO. At least one of the one or more of the sputter targets may include an elemental metal selected from the group consisting of: nickel, tungsten, and tantalum. In some cases, at least one of the one or more of the sputter targets may include an alloy including two or more metals selected from the group consisting of: nickel, tungsten, and tantalum. At least one of the one or more sputter targets may include an oxide in some cases. In various embodiments, the anodically coloring layer may be substantially amorphous.

The cathodically coloring layer and the anodically coloring layer may be formed in direct physical contact with one another, without a separately deposited ion conductor layer between them. In some implementations, the anodically coloring layer includes two or more sub-layers that have different compositions and/or morphologies. In certain embodiments the cathodically coloring electrochromic material includes tungsten oxide ($WO_x$). In some such cases, x may be less than 3.0. In these or other cases, x may be at least about 2.7. In various implementations, the cathodically coloring layer may include a bilayer or a graded layer, and a portion of the cathodically coloring layer may be superstoichiometric with respect to oxygen.

In another aspect of the disclosed embodiments, an electrochromic stack is provided, the electrochromic stack including: a cathodically coloring layer including a cathodically coloring material; and an anodically coloring layer including nickel tungsten tantalum oxide (NiWTaO). The NiWTaO may have a particular composition in some cases. For instance, the NiWTaO may an atomic ratio of Ni:(W+Ta) that is between about 1.5:1 and 3:1, or between about 1.5:1 and 2.5:1, or between about 1.8:1 and 2.5:1, or between about 2:1 and 2.5:1, or between about 2:1 and 3:1. In these or other cases, the NiWTaO may have an atomic ratio of W:Ta that is between about 0.1:1 and 6:1, or between about 0.2:1 and 5:1, or between about 0.2:1 and 1:1, or between about 1:1 and 2:1. The anodically coloring layer may be substantially amorphous. In some cases, the anodically coloring layer may include an amorphous matrix of a first material having domains of a second material scattered throughout the amorphous matrix.

The cathodically coloring layer may be in direct physical contact with the anodically coloring layer in some cases. In a number of embodiments, the anodically coloring layer may include two or more sub-layers having different compositions and/or morphologies. In certain embodiments the cathodically coloring material includes tungsten oxide (WO$_x$). In some such cases, x may be less than 3.0. In these or other cases, x may be at least about 2.7. In various implementations, the cathodically coloring layer may include a bilayer or a graded layer, and a portion of the cathodically coloring layer may be superstoichiometric with respect to oxygen.

In a further aspect of the disclosed embodiments, an integrated deposition system for fabricating an electrochromic stack is provided, the system including: a plurality of deposition stations aligned in series and interconnected and operable to pass a substrate from one station to the next without exposing the substrate to an external environment, where the plurality of deposition stations include (i) a first deposition station containing one or more material sources for depositing a cathodically coloring layer; (ii) a second deposition station containing one or more material sources for depositing an anodically coloring layer including nickel tungsten tantalum oxide (NiWTaO); and a controller containing program instructions for passing the substrate through the plurality of stations in a manner that deposits on the substrate (i) the cathodically coloring layer, and (ii) the anodically coloring layer to form a stack including at least the cathodically coloring layer and the anodically coloring layer.

The NiWTaO may be deposited to include a particular composition in some cases. For example, the NiWTaO may haves an atomic ratio of Ni:(W+Ta) that is between about 1.5:1 and 3:1, or between about 1.5:1 and 2.5:1, or between about 1.8:1 and 2.5:1, or between about 2:1 and 2.5:1, or between about 2:1 and 3:1. In these or other cases, the NiWTaO may have an atomic ratio of W:Ta that is between about 0.1:1 and 6:1, or between about 0.2:1 and 5:1, or between about 0.2:1 and 1:1, or between about 1:1 and 2:1.

In certain implementations, at least one of the one or more material sources for depositing the anodically coloring layer include an elemental metal selected from the group consisting of: nickel, tungsten, and tantalum. In these or other implementations, at least one of the one or more material sources for depositing the anodically coloring layer include an alloy including two or more metals selected from the group consisting of: nickel, tungsten, and tantalum. In some embodiments, at least one of the one or more material sources for depositing the anodically coloring layer include an oxide. The anodically coloring layer may be deposited to include a particular morphology in some cases. For instance, the deposition system may be configured to deposit the anodically coloring layer as a substantially amorphous material.

In these or other cases, the integrated deposition system may be configured to deposit the cathodically coloring layer and the anodically coloring layer in direct physical contact with one another. Further, the anodically coloring layer may be deposited to include a particular structure. In some embodiments, for instance, the controller may contain program instructions for depositing the anodically coloring layer as two or more sub-layers having different compositions and/or morphologies. The sub-layers of the anodically coloring layer may all be deposited in the second deposition station, though in some cases one or more sub-layers of the anodically coloring layer may be deposited in a third deposition station. In certain embodiments the cathodically coloring layer includes tungsten oxide (WO$_x$). In some such cases, x may be less than 3.0. In these or other cases, x may be at least about 2.7. In various implementations, the cathodically coloring layer may include a bilayer or a graded layer, and a portion of the cathodically coloring layer may be superstoichiometric with respect to oxygen.

In a further aspect of the disclosed embodiments, a composition of matter is provided, including: (a) nickel; (b) tungsten; (c) tantalum; and (d) oxygen, where the composition includes an atomic ratio of Ni:(W+Ta) that is between about 1.5:1 and 3:1, and an atomic ratio of W:Ta that is between about 0.1:1 and 6:1.

In certain embodiments, the atomic ratio of Ni:(W+Ta) may be between about 1.5:1 and 3:1, or between about 1.5:1 and 2.5:1, or between about 1.8:1 and 2.5:1, or between about 2:1 and 2.5:1, or between about 2:1 and 3:1. In these or other embodiments, the atomic ratio of W:Ta may be between about 0.1:1 and 6:1, or between about 0.2:1 and 5:1, or between about 0.2:1 and 1:1, or between about 1:1 and 2:1. The composition may be provided in a layer having a thickness between about 50-650 nm. The composition may be formed through sputtering one or more sputter targets. In various embodiments, the composition becomes tinted in response to an applied anodic potential.

In some implementations, the composition is amorphous. In some cases, the composition is provided as an amorphous matrix with nanocrystals distributed throughout. The nanocrystals may have a mean diameter of about 50 nm or less, in some cases a mean diameter between about 1-10.

These and other features and advantages of the disclosed embodiments will be described in further detail below, with reference to the associated drawings.

BRIEF DESCRIPTION OF THE DRAWINGS

The following detailed description can be more fully understood when considered in conjunction with the drawings in which:

FIG. 5D depicts an integrated deposition system with two lithium deposition stations.

FIG. 5E depicts an integrated deposition system with one lithium deposition station.

DETAILED DESCRIPTION

Electrochromic Devices

Figure 1A:
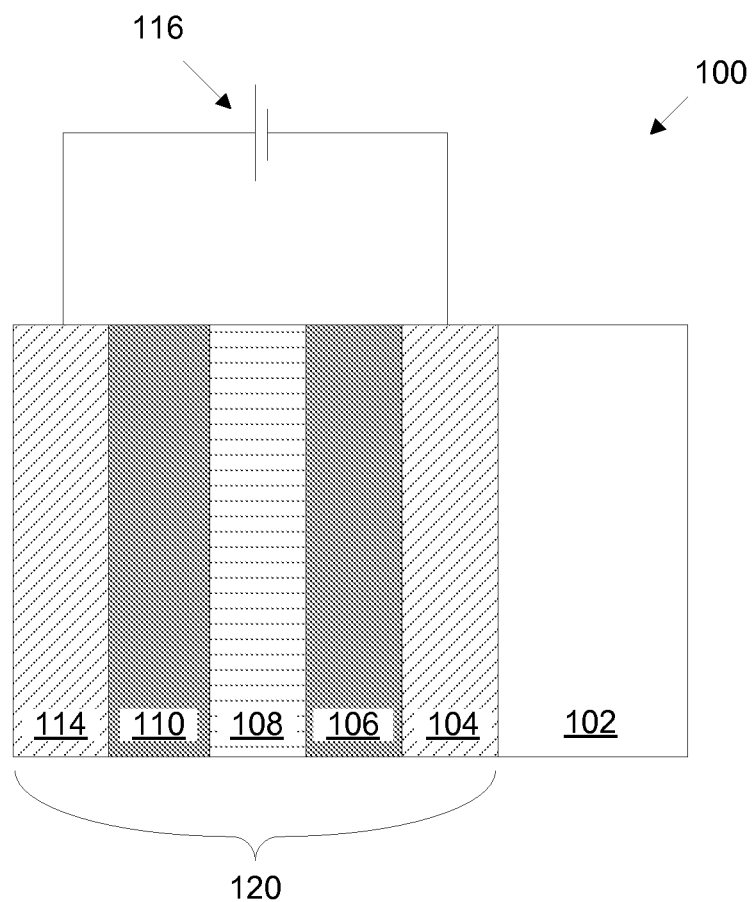
FIGS. 1A-1C present schematic cross-sections of electrochromic devices in accordance with certain embodiments.

A schematic cross-section of an electrochromic device 100 in accordance with some embodiments is shown in FIG. 1A. The electrochromic device includes a substrate 102, a conductive layer (CL) 104, an electrochromic layer (EC) 106 (sometimes also referred to as a cathodically coloring layer), an ion conducting layer (IC) 108, a counter electrode layer (CE) 110 (sometimes also referred to as an anodically coloring layer), and a conductive layer (CL) 114. Elements 104, 106, 108, 110, and 114 are collectively referred to as an electrochromic stack 120. In certain implementations, a heterogeneous counter electrode may be used, as described in relation to FIGS. 1B-1G, below.

A voltage source 116 operable to apply an electric potential across the electrochromic stack 120 effects the transition of the electrochromic device from, e.g., a clear state to a tinted state. In other embodiments, the order of layers is reversed with respect to the substrate. That is, the layers are in the following order: substrate, conductive layer, counter electrode layer, ion conducting layer, electrochromic material layer, conductive layer.

It should be understood that the reference to a transition between a clear state and tinted state is non-limiting and suggests only one example, among many, of an electrochromic transition that may be implemented. Unless otherwise specified herein, whenever reference is made to a clear-tinted transition, the corresponding device or process encompasses other optical state transitions such as non-reflective-reflective, transparent-opaque, etc. Further the terms "clear" and "bleached" refer to an optically neutral state, e.g., untinted, transparent or translucent. Still further, unless specified otherwise herein, the "color" or "tint" of an electrochromic transition is not limited to any particular wavelength or range of wavelengths. As understood by those of skill in the art, the choice of appropriate electrochromic and counter electrode materials governs the relevant optical transition. In various embodiments herein, a counter electrode is fabricated to include nickel, tungsten, tantalum, and oxygen, sometimes referred to as nickel tungsten tantalum oxide or NiWTaO. The individual elements may be present at varying levels/concentrations. In certain embodiments, for instance, a NiWTaO counter electrode may have a composition that falls within the various composition ranges disclosed herein.

In certain embodiments, the electrochromic device reversibly cycles between a clear state and a tinted state. In the clear state, a potential is applied to the electrochromic stack 120 such that available ions in the stack that can cause the electrochromic material 106 to be in the tinted state reside primarily in the counter electrode 110. When the potential on the electrochromic stack is reversed, the ions are transported across the ion conducting layer 108 to the electrochromic material 106 and cause the material to enter the tinted state.

In certain embodiments, all of the materials making up electrochromic stack 120 are inorganic, solid (i.e., in the solid state), or both inorganic and solid. Because organic materials tend to degrade over time, inorganic materials offer the advantage of a reliable electrochromic stack that can function for extended periods of time. Materials in the solid state also offer the advantage of not having containment and leakage issues, as materials in the liquid state often do. Each of the layers in the electrochromic device is discussed in detail, below. It should be understood that any one or more of the layers in the stack may contain some amount of organic material, but in many implementations one or more of the layers contains little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Referring again to FIG. 1A, voltage source 116 is typically a low voltage electrical source and may be configured to operate in conjunction with radiant and other environmental sensors. Voltage source 116 may also be configured to interface with an energy management system, such as a computer system that controls the electrochromic device according to factors such as the time of year, time of day, and measured environmental conditions. Such an energy management system, in conjunction with large area electrochromic devices (i.e., an electrochromic window), can dramatically lower the energy consumption of a building.

Any material having suitable optical, electrical, thermal, and mechanical properties may be used as substrate 102. Such substrates include, for example, glass, plastic, and mirror materials. Suitable plastic substrates include, for example acrylic, polystyrene, polycarbonate, allyl diglycol carbonate, SAN (styrene acrylonitrile copolymer), poly(4-methyl-1-pentene), polyester, polyamide, etc. If a plastic substrate is used, it is preferably barrier protected and abrasion protected using a hard coat of, for example, a diamond-like protection coating, a silica/silicone anti-abrasion coating, or the like, such as is well known in the plastic glazing art. Suitable glasses include either clear or tinted soda lime glass, including soda lime float glass. The glass may be tempered or untempered. In some embodiments of electrochromic device 100 with glass, e.g. soda lime glass, used as substrate 102, there is a sodium diffusion barrier layer (not shown) between substrate 102 and conductive layer 104 to prevent the diffusion of sodium ions from the glass into conductive layer 104.

In some embodiments, the optical transmittance (i.e., the ratio of transmitted radiation or spectrum to incident radiation or spectrum) of substrate 102 is about 40 to 95%, e.g., about 90-92%. The substrate may be of any thickness, as long as it has suitable mechanical properties to support the electrochromic stack 120. While the substrate 102 may be of any size, in some embodiments, it is about 0.01 mm to 10 mm thick, preferably about 3 mm to 9 mm thick.

In some embodiments, the substrate is architectural glass. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, e.g., as large as about 72 inches by 120 inches. Architectural glass is typically at least about 2 mm thick. Architectural glass that is less than about 3.2 mm thick cannot be tempered. In some embodiments with architectural glass as the substrate, the substrate may still be tempered even after the electrochromic stack has been fabricated on the substrate. In some embodiments with architectural glass as the substrate, the substrate is a soda lime glass from a tin float line.

On top of substrate 102 is conductive layer 104. In certain embodiments, one or both of the conductive layers 104 and 114 is inorganic and/or solid. Conductive layers 104 and 114 may be made from a number of different materials, including conductive oxides, thin metallic coatings, conductive metal nitrides, and composite conductors. Typically, conductive layers 104 and 114 are transparent at least in the range of wavelengths where electrochromism is exhibited by the electrochromic layer. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide and the like.

Since oxides are often used for these layers, they are sometimes referred to as "transparent conductive oxide" (TCO) layers. Thin metallic coatings that are substantially transparent may also be used. Examples of metals used for such thin metallic coatings include transition metals including gold, platinum, silver, aluminum, nickel alloy, and the like. Thin metallic coatings based on silver, well known in the glazing industry, are also used. Examples of conductive nitrides include titanium nitrides, tantalum nitrides, titanium oxynitrides, and tantalum oxynitrides. The conductive layers 104 and 114 may also be composite conductors. Such composite conductors may be fabricated by placing highly conductive ceramic and metal wires or conductive layer patterns on one of the faces of the substrate and then over-coating with transparent conductive materials such as doped tin oxides or indium tin oxide. Ideally, such wires should be thin enough as to be invisible to the naked eye (e.g., about 100 μm or thinner).

In some embodiments, commercially available substrates such as glass substrates contain a transparent conductive layer coating. Such products may be used for both substrate 102 and conductive layer 104. Examples of such glasses include conductive layer coated glasses sold under the trademark TEC Glass™ by Pilkington, of Toledo, Ohio and SUNGATE™ 300 and SUNGATE™ 500 by PPG Industries of Pittsburgh, Pa. TEC Glass™ is a glass coated with a fluorinated tin oxide conductive layer. In other embodiments the substrate may be annealed glass, e.g. thin glass made by Corning, Inc. of Corning N.Y., such as Gorilla Glass™, Willow Glass™, Eagle Glass™ and the like.

In some embodiments, the same conductive layer is used for both conductive layers (i.e., conductive layers 104 and 114). In some embodiments, different conductive materials are used for each conductive layer 104 and 114. For example, in some embodiments, TEC Glass™ is used for substrate 102 (float glass) and conductive layer 104 (fluorinated tin oxide) and indium tin oxide is used for conductive layer 114. As noted above, in some embodiments employing TEC Glass™ there is a sodium diffusion barrier between the glass substrate 102 and TEC conductive layer 104. Some glasses are low sodium and do not require a sodium diffusion barrier.

The function of the conductive layers is to spread an electric potential provided by voltage source 116 over surfaces of the electrochromic stack 120 to interior regions of the stack, with very little ohmic potential drop. The electric potential is transferred to the conductive layers though electrical connections to the conductive layers. In some embodiments, bus bars, one in contact with conductive layer 104 and one in contact with conductive layer 114, provide the electric connection between the voltage source 116 and the conductive layers 104 and 114. The conductive layers 104 and 114 may also be connected to the voltage source 116 with other conventional means.

In some embodiments, the thickness of conductive layers 104 and 114 is between about 5 nm and about 10,000 nm. In some embodiments, the thickness of conductive layers 104 and 114 are between about 10 nm and about 1,000 nm. In other embodiments, the thickness of conductive layers 104 and 114 are between about 10 nm and about 500 nm.

The thickness of the each conductive layer 104 and 114 is also substantially uniform. Smooth layers (i.e., low roughness, Ra) of the conductive layer 104 are desirable so that other layers of the electrochromic stack 120 are more compliant. The sheet resistance ($R_s$) of the conductive layers is also important because of the relatively large area spanned by the layers. In some embodiments, the sheet resistance of conductive layers 104 and 114 is about 1 to 30 Ohms per square. In some embodiments, the sheet resistance of conductive layers 104 and 114 is about 15 Ohms per square. In general, it is desirable that the sheet resistance of each of the two conductive layers be about the same. In one embodiment, the two layers each have a sheet resistance of about 10-15 Ohms per square. In certain embodiments conductive layers may be themselves stack structures, e.g., a stack of transparent conductive oxide/metal/transparent conductive oxide, e.g., ITO/Ag/ITO and similar transparent conductive layers known to skilled artisans. In such layers, e.g., the metal inner layer is typically thin enough so as to be transparent, e.g., between about 0.5 nm and about 20 nm thick, or between about 1 nm and about 10 nm thick, or between about 1 nm and about 5 nm thick. The metal interlayer, e.g., silver, may be doped with other metals to increase its flexibility and/or ductility, e.g., silver interlayers may be doped with bismuth, beryllium and/or other metals. Such dopants may be, e.g., between about 1% to 25% by weight of the metal interlayer, e.g., between about 1% and about 20%, e.g., between about 1% and about 10%, e.g., between about 1% and about 5%.

Overlaying conductive layer 104 is cathodically coloring layer 106 (also referred to as electrochromic layer 106). In certain embodiments, electrochromic layer 106 is inorganic and/or solid, in typical embodiments inorganic and solid. The electrochromic layer may contain any one or more of a number of different cathodically coloring electrochromic materials, including metal oxides. Such metal oxides include, e.g., tungsten oxide ($WO_3$), molybdenum oxide ($MoO_3$), niobium oxide ($Nb_2O_5$), titanium oxide ($TiO_2$), vanadium oxide ($V_2O_5$) and tantalum oxide ($Ta_2O_5$). In some embodiments, the cathodically coloring metal oxide is doped with one or more dopants such as lithium, sodium, potassium, molybdenum, vanadium, titanium, and/or other suitable metals or compounds containing metals. Such dopants can be cathodically coloring, anodically coloring, or non-electrochromic, so long as the bulk material is cathodically coloring. For example, mixed oxides (e.g., W—Mo oxide, W—V oxide) are also used in certain embodiments. An electrochromic layer 106 comprising a metal oxide is capable of receiving ions transferred from counter electrode layer 110.

In some embodiments, tungsten oxide or doped tungsten oxide is used for electrochromic layer 106. In one embodiment, the electrochromic layer is made substantially of $WO_x$, where "x" refers to an atomic ratio of oxygen to tungsten in the electrochromic layer, and x is between about 2.7 and 3.5. It has been suggested that only sub-stoichiometric tungsten oxide exhibits electrochromism; i.e., stoichiometric tungsten oxide, $WO_3$, does not exhibit electrochromism. In a more specific embodiment, $WO_x$, where x is less than 3.0 and at least about 2.7 is used for the electrochromic layer. In another embodiment, the electrochromic layer is WOx, where x is between about 2.7 and about 2.9. Techniques such as Rutherford Backscattering Spectroscopy (RBS) can identify the total number of oxygen atoms which include those bonded to tungsten and those not bonded to tungsten. In some instances, tungsten oxide layers where x is 3 or greater exhibit electrochromism, presumably due to unbound excess oxygen along with sub-stoichiometric tungsten oxide. In another embodiment, the tungsten oxide layer has stoichiometric or greater oxygen, where x is 3.0 to about 3.5.

In certain embodiments, the tungsten oxide is crystalline, nanocrystalline, or amorphous. In some embodiments, the tungsten oxide is substantially nanocrystalline, with grain sizes, on average, from about 5 nm to 50 nm (or from about 5 nm to 20 nm), as characterized by transmission electron microscopy (TEM). The tungsten oxide morphology may also be characterized as nanocrystalline using x-ray diffraction (XRD). For example, nanocrystalline electrochromic tungsten oxide may be characterized by the following XRD features: a crystal size of about 10 to 100 nm (e.g., about 55 nm. Further, nanocrystalline tungsten oxide may exhibit limited long range order, e.g., on the order of several (about 5 to 20) tungsten oxide unit cells.

The thickness of the electrochromic layer 106 depends on the cathodically coloring material selected for the electrochromic layer. In some embodiments, the electrochromic layer 106 is about 50 nm to 2,000 nm, or about 200 nm to 700 nm thick. In some embodiments, the electrochromic layer is about 300 nm to about 500 nm. The thickness of the electrochromic layer 106 is also substantially uniform. In one embodiment, a substantially uniform electrochromic layer varies only about ±10% in each of the aforementioned thickness ranges. In another embodiment, a substantially uniform electrochromic layer varies only about ±5% in each of the aforementioned thickness ranges. In another embodiment, a substantially uniform electrochromic layer varies only about ±3% in each of the aforementioned thickness ranges.

Generally, in cathodically coloring electrochromic materials, the colorization/tinting (or change in any optical property—e.g., absorbance, reflectance, and transmittance) of the electrochromic material is caused by reversible ion insertion into the material (e.g., intercalation) and a corresponding injection of a charge balancing electron. Typically some fraction of the ion responsible for the optical transition is irreversibly bound up in the electrochromic material. As explained below, some or all of the irreversibly bound ions are used to compensate "blind charge" in the material. In most electrochromic materials, suitable ions include lithium ions ($Li^+$) and hydrogen ions ($H^+$) (i.e., protons). In some cases, however, other ions will be suitable. These include, for example, deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In various embodiments described herein, lithium ions are used to produce the electrochromic phenomena. Intercalation of lithium ions into tungsten oxide ($WO_{3-y}$ ($0<y\leq\sim 0.3$)) causes the tungsten oxide to change from transparent (clear state) to blue (tinted state).

Referring again to FIG. 1A, in electrochromic stack 120, ion conducting layer 108 overlays electrochromic layer 106. On top of ion conducting layer 108 is anodically coloring layer 110 (also referred to as counter electrode layer 110). In certain embodiments, this ion conducting layer 108 is omitted, and the cathodically coloring electrochromic layer 106 is in direct physical contact with the anodically coloring counter electrode layer 110. In some embodiments, counter electrode layer 110 is inorganic and/or solid. The counter electrode layer may comprise one or more of a number of different materials that are capable of serving as reservoirs of ions when the electrochromic device is in the clear state. In this respect the anodically coloring counter electrode layer is termed an "ion storage layer" in some contexts. During an electrochromic transition initiated by, e.g., application of an appropriate electric potential, the anodically coloring counter electrode layer transfers some or all of the ions it holds to the cathodically coloring electrochromic layer, changing the electrochromic layer to the tinted state. Concurrently, in the case of NiWTaO, the counter electrode layer tints with the loss of ions.

In various embodiments, the anodically coloring counter electrode material includes nickel, tungsten, tantalum, and oxygen. The materials may be provided together as NiWTaO, at any appropriate composition. The NiWTaO material is especially beneficial as an anodically coloring material because it is particularly clear or color neutral in the clear state. Many counter electrode materials are slightly tinted (colored) even in their clear states. For instance, NiO is brown and NiWO generally has a slight yellow tint in the clear state. For aesthetic reasons, it is preferable that both the cathodically coloring and anodically coloring materials in an electrochromic device are very clear (transparent) and colorless when the device is in the clear state.

Further, some counter electrode materials exhibit good color qualities (i.e., are very clear in their clear state), but are unsuitable for commercial use because the materials' ability to undergo rapid optical transitions fades over time. In other words, for these materials the duration of an optical transition increases with the age/use of the device. In this case, a newly fabricated window would exhibit higher switching speeds than an identical window that has been in use for e.g., six months. One example of an anodically coloring counter electrode material that shows good color quality but decreasing transition speed over time is nickel tantalum oxide (NiTaO). The inclusion of tungsten in such a material has been shown to significantly reduce the decrease in switching speed over time. As such, NiWTaO is a valuable candidate for the anodically coloring counter electrode material.

The NiWTaO may have various compositions when used as an anodically coloring material. In certain embodiments, particular balances may be made between the various components of the NiWTaO. For instance, an atomic ratio of Ni:(W+Ta) in the material may fall between about 1.5:1 and 3:1, for example between about 1.5:1 and 2.5:1, or between about 2:1 and 2.5:1. In a particular example the atomic ratio of Ni:(W+Ta) is between about 2:1 and 3:1. The atomic ratio of Ni:(W+Ta) relates to the ratio of (i) nickel atoms in the material to (ii) the sum of the number of tungsten and tantalum atoms in the material.

The NiWTaO material may also have a particular atomic ratio of W:Ta. In certain embodiments, the atomic ratio of W:Ta is between about 0.1:1 and 6:1, for example between about 0.2:1 and 5:1, or between about 1:1 and 3:1, or between about 1.5:1 and 2.5:1, or between about 1.5:1 and 2:1. In some cases the atomic ratio of W:Ta is between about 0.2:1 and 1:1, or between about 1:1 and 2:1, or between about 2:1 and 3:1, or between about 3:1 and 4:1, or between about 4:1 and 5:1. In some implementations, particular atomic ratios of Ni:(W+Ta) and W:Ta are used. All combinations of disclosed Ni:(W+Ta) compositions and disclosed W:Ta compositions are contemplated, though only certain combinations are explicitly listed herein. For instance, the atomic ratio of Ni:(W+Ta) may be between about 1.5:1 and 3:1, where the atomic ratio of W:Ta is between about 1.5:1 and 3:1. In another example, the atomic ratio of Ni:(W+Ta) may be between about 1.5:1 and 2.5:1, where the atomic ratio of W:Ta is between about 1.5:1 and 2.5:1. In a further example, the atomic ratio of Ni:(W+Ta) may be between about 2:1 and 2.5:1, where the atomic ratio of W:Ta is between about 1.5:1 and 2:1, or between about 0.2:1 and 1:1, or between about 1:1 and 2:1, or between about 4:1 and 5:1.

Other example materials for the counter electrode include, but are not limited to, nickel oxide, nickel tungsten oxide, nickel vanadium oxide, nickel chromium oxide, nickel aluminum oxide, nickel manganese oxide, nickel magnesium oxide, chromium oxide, iron oxide, cobalt oxide, rhodium oxide, iridium oxide, manganese oxide, Prussian blue. The materials (e.g., metal and oxygen) may be provided at different stoichiometric ratios as appropriate for a given application. Optically passive counter electrodes may be used in some cases. In certain cases, the counter electrode material may comprise cerium titanium oxide, cerium zirconium oxide, nickel oxide, nickel-tungsten oxide, vanadium oxide, and mixtures of oxides (e.g., a mixture of NiO and/or $Ni_2O_3$ with $WO_3$). Doped formulations of these oxides may also be used, with dopants including, e.g., tantalum and tungsten and the other additives listed above.

Because anodically coloring counter electrode layer 110 contains the ions used to produce the electrochromic phenomenon in the cathodically coloring electrochromic material when the cathodically coloring electrochromic material is in the clear state, the anodically coloring counter electrode preferably has high transmittance and a neutral color when it holds significant quantities of these ions.

When charge is removed from an anodically coloring counter electrode 110, e.g., made of conventional nickel tungsten oxide (i.e., ions are transported from the counter electrode 110 to the electrochromic layer 106), the counter electrode layer will turn from a (more or less) transparent state to a brown tinted state. Similarly, when charge is removed from an anodically coloring counter electrode 110 made of NiWTaO, the counter electrode layer will turn from a transparent state to a brown tinted state. However, the transparent state of a NiWTaO counter electrode layer may be clearer, having less color (particularly less yellow color, for example) than the transparent state of a NiWO counter electrode layer.

The counter electrode morphology may be crystalline, amorphous, or some mixture thereof. Crystalline phases may be nanocrystalline. In some embodiments, the nickel tungsten tantalum oxide (NiWTaO) counter electrode material is amorphous or substantially amorphous. Various substantially amorphous counter electrodes have been found to perform better, under some conditions, in comparison to their crystalline counterparts. The amorphous state of the counter electrode oxide material may be obtained through the use of certain processing conditions, described below. While not wishing to be bound to any theory or mechanism, it is believed that amorphous nickel-tungsten oxide or nickel-tungsten-tantalum oxide is produced by relatively low energy atoms in the sputtering process. Low energy atoms are obtained, for example, in a sputtering process with lower target powers, higher chamber pressures (i.e., lower vacuum), and/or larger source to substrate distances. Amorphous films are also more likely to form where there is a relatively higher fraction/concentration of heavy atoms (e.g., W). Under the described process conditions films with better stability under UV/heat exposure are produced. Substantially amorphous materials may have some crystalline, typically but not necessarily nanocrystalline, material dispersed in the amorphous matrix. The grain size and amounts of such crystalline materials are described in more detail below.

In some embodiments, the counter electrode morphology may include microcrystalline, nanocrystalline and/or amorphous phases. For example, the counter electrode may be, e.g., a material with an amorphous matrix having nanocrystals distributed throughout. In certain embodiments, the nanocrystals constitute about 50% or less of the counter electrode material, about 40% or less of the counter electrode material, about 30% or less of the counter electrode material, about 20% or less of the counter electrode material or about 10% or less of the counter electrode material (by weight or by volume depending on the embodiment). In certain embodiments, the nanocrystals have a maximum diameter of less than about 50 nm, in some cases less than about 25 nm, less than about 10 nm, or less than about 5 nm. In some cases, the nanocrystals have a mean diameter of about 50 nm or less, or about 10 nm or less, or about 5 nm or less (e.g., about 1-10 nm).

In certain embodiments, it is desirable to have a nanocrystal size distribution where at least about 50% of the nanocrystals have a diameter within 1 standard deviation of the mean nanocrystal diameter, for example where at least about 75% of the nanocrystals have a diameter within 1 standard deviation of the mean nanocrystal diameter or where at least about 90% of the nanocrystals have a diameter within 1 standard deviation of the mean nanocrystal diameter.

It has been found that counter electrodes that include an amorphous matrix tend to operate more efficiently compared to counter electrodes that are relatively more crystalline. In certain embodiments, the additive may form a host matrix in which domains of the base anodically coloring material may be found. In various cases, the host matrix is substantially amorphous. In certain embodiments, the only crystalline structures in the counter electrode are formed from a base anodically coloring electrochromic material in, e.g., oxide form. One example of a base anodically coloring electrochromic material in oxide form is nickel tungsten oxide. Additives may contribute to forming an amorphous host matrix that is not substantially crystalline, but which incorporates domains (e.g., nanocrystals in some cases) of the base anodically coloring electrochromic material. One example additive is tantalum. In other embodiments, the additive and the anodically coloring base material together form a chemical compound with covalent and/or ionic bonding. The compound may be crystalline, amorphous, or a combination thereof. In other embodiments, the anodically coloring base material forms a host matrix in which domains of the additive exist as discrete phases or pockets. For example certain embodiments include an amorphous counter electrode having an amorphous matrix of a first material, with a second material, also amorphous, distributed throughout the first material in pockets, for example, pockets of the diameters described herein for crystalline materials distributed throughout an amorphous matrix.

In some embodiments, the thickness of the counter electrode is about 50 nm about 650 nm. In some embodiments, the thickness of the counter electrode is about 100 nm to about 400 nm, sometimes in the range of about 150 nm to 300 nm, or between about 200 nm to 300 nm. The thickness of the counter electrode layer 110 is also substantially uniform. In one embodiment, a substantially uniform counter electrode layer varies only about ±10% in each of the aforementioned thickness ranges. In another embodiment, a substantially uniform counter electrode layer varies only about ±5% in each of the aforementioned thickness ranges. In another embodiment, a substantially uniform counter electrode layer varies only about ±3% in each of the aforementioned thickness ranges.

The amount of ions held in the counter electrode layer during the clear state (and correspondingly in the electrochromic layer during the tinted state) and available to drive the electrochromic transition depends on the composition of the layers as well as the thickness of the layers and the fabrication method. Both the electrochromic layer and the counter electrode layer are capable of supporting available charge (in the form of lithium ions and electrons) in the neighborhood of several tens of millicoulombs per square centimeter of layer surface area. The charge capacity of an electrochromic film is the amount of charge that can be loaded and unloaded reversibly per unit area and unit thickness of the film by applying an external voltage or potential. In one embodiment, the $WO_3$ layer has a charge capacity of between about 30 and about 150 $mC/cm^2$/micron. In another embodiment, the $WO_3$ layer has a charge capacity of between about 50 and about 100 $mC/cm^2$/micron. In one embodiment, the NiWTaO layer has a charge capacity of between about 75 and about 200 $mC/cm^2$/micron. In another embodiment, the NiWTaO layer has a charge capacity of between about 100 and about 150 $mC/cm^2$/micron.

Returning to FIG. 1A, in between electrochromic layer 106 and counter electrode layer 110, there is often an ion conducting layer 108. Ion conducting layer 108 serves as a medium through which ions are transported (in the manner of an electrolyte) when the electrochromic device transforms between the clear state and the tinted state. Preferably, ion conducting layer 108 is highly conductive to the relevant ions for the electrochromic and the counter electrode layers, but has sufficiently low electron conductivity that negligible electron transfer takes place during normal operation. A thin ion conducting layer (also sometimes referred to as an ion conductor layer) with high ionic conductivity permits fast ion conduction and hence fast switching for high performance electrochromic devices. In certain embodiments, the ion conducting layer 108 is inorganic and/or solid. When fabricated from a material and in a manner that produces relatively few defects, the ion conductor layer can be made very thin to produce a high performance device. In various implementations, the ion conductor material has an ionic conductivity of between about $10^8$ Siemens/cm or $ohm^{-1}$ $cm^{-1}$ and about $10^9$ Siemens/cm or $ohm^{-1}$ $cm^{-1}$ and an electronic resistance of about $10^{11}$ ohms-cm.

In other embodiments, the ion conductor layer may be omitted. In such embodiments, no separate ion conductor material is deposited when forming an electrochromic stack for an electrochromic device. Instead, in these embodiments the cathodically coloring electrochromic material may be deposited in direct physical contact with the anodically coloring counter electrode material. One or both of the anodically coloring and cathodically coloring materials may be deposited to include a portion that is oxygen rich compared to the remaining portion of the material. Typically, the oxygen rich portion is in contact with the other type of layer. For instance, an electrochromic stack may include an anodically coloring material in contact with a cathodically coloring material, where the cathodically coloring material includes an oxygen-rich portion in direct physical contact with the anodically coloring material. In another example, an electrochromic stack includes an anodically coloring material in contact with a cathodically coloring material, where the anodically coloring material includes an oxygen-rich portion in direct physical contact with the cathodically coloring material. In a further example, both the anodically coloring material and the cathodically coloring material include an oxygen-rich portion, where the oxygen-rich portion of the cathodically coloring material is in direct physical contact with the oxygen-rich portion of the anodically coloring material. The oxygen-rich portions of these layers may be provided as distinct sub-layers (e.g., a cathodically or anodically coloring material includes an oxygen-rich sublayer and a less-oxygen-rich sublayer). The oxygen-rich portion of the layers may also be provided in a graded layer (e.g., the cathodically or anodically coloring material may include a gradient in oxygen concentration, the gradient being in a direction normal to the surface of the layers. Embodiments where the ion conductor layer is omitted and the anodically coloring counter electrode material is in direct contact with the cathodically coloring electrochromic material are further discussed in the following U.S. patents, each of which is herein incorporated by reference in its entirety: U.S. Pat. No. 8,300,298, and U.S. Pat. No. 8,764,950.

In one embodiment the electrochromic layer is formed with an oxygen rich region which is converted to the interfacial region or layer serving as an IC layer upon subsequent processing after the counter electrode layer is deposited. In some embodiments, a distinct layer which includes an oxygen rich version of an electrochromic material is used to (ultimately) form an interfacial layer serving as an IC layer between the EC and CE layers. In other embodiments, a distinct layer which includes an oxygen rich version of a counter electrode material is used to (ultimately) form an interfacial region serving as an IC layer between the EC and CE layers. All or a portion of the oxygen rich CE layer is converted to the interfacial region. In yet other embodiments, a distinct layer which includes an oxygen rich version of a counter electrode material and an oxygen rich form of an electrochromic material is used to (ultimately) form an interfacial region serving as an IC layer between the EC and CE layers. In other words, some or all of oxygen rich material serves as a precursor to the interfacial region that serves as an IC layer. Methods of the invention can not only reduce process steps, but produce electrochromic devices showing improved performance characteristics.

As mentioned, it is believed that some of the EC and/or CE layer in an interfacial region is converted to a material that provides one or more functions of an IC layer, notably high conductivity for ions and high resistivity for electrons. The IC functional material in the interfacial region may be, for example, a salt of the conductive cations; for example, a lithium salt.

While not wishing to be bound to theory, it is believed that one or more of the following mechanisms may affect the transformation of EC and/or CE material to an IC functioning material in the interfacial region. However, the performance or application of the invention is not limited to any of these mechanisms. Each of these mechanisms is consistent with a process in which IC layer material is never deposited during fabrication of the stack. As is made clear elsewhere herein, apparatus of the invention need not have a separate target comprising material for an IC layer.

In a first mechanism, the direct lithiation of the electrochromic material or the counter electrode material produces an IC material (for example, a lithium tungstate) in the interfacial region. As explained more fully below various embodiments employ direct lithiation of one of the active layers at a point in the fabrication process between the formation of the EC and CE layers. This operation involves exposure of the EC or CE layer (whichever is formed first) to lithium. According to this mechanism, a flux of lithium passing through the EC or CE layer produces an ionically conductive, electronically resistive material such as a lithium salt. Heating or other energy can be applied to drive this flux of lithium. This described mechanism converts the top or exposed portion of the first formed layer (EC or CE layer) prior to formation of the second layer (CE or EC layer).

In a second mechanism, lithium diffusing from one of the EC or CE to the other layer, after both layers have formed and/or during formation of a second layer upon a lithiated first layer, causes conversion of part of one of the EC and/or CE at their interface to the interfacial region having the IC functioning material. The lithium diffusion may take place after all the second layer has formed or after only some fraction of the second layer has formed. Further, the diffusion of lithium and consequent conversion to IC functional material take place in either the first or second deposited layers and in either the EC or CE layer. In one example, the EC layer is formed first and then lithiated. As the CE layer is subsequently deposited on top of the EC layer, some lithium diffuses from the underlying EC layer toward and/or into the CE layer causing a transformation to an interfacial region which contains an IC functioning material. In another example, the EC layer formed first (optionally with an oxygen rich upper region), then the CE layer is formed and lithiated. Subsequently some lithium from the CE layer diffuses into the EC layer where it forms the interfacial region having the IC functioning material. In yet another example, the EC layer is deposited first and then lithiated to produce some IC functioning material according to first the mechanism described above. Then, when the CE layer is formed, some lithium diffuses from the underlying EC layer toward the CE layer to produce some IC material in an interfacial region of the CE layer. In this manner, the IC functioning material nominally resides in both the CE and EC layers proximate their interface.

In a third mechanism, the EC and CE layers are formed to completion (or at least to the point where the second formed layer is partially complete). Then, the device structure is heated and the heating converts at least some of the material in the interfacial region to an IC functioning material (for example, a lithium salt). Heating, for example as part of a multistep thermochemical conditioning (MTCC) as described further herein, may be performed during deposition or after deposition is completed. In one embodiment, the heating is performed after a transparent conductive oxide is formed on the stack. In another embodiment, heating is applied after the second layer is partially or wholly complete, but before a transparent conductive oxide is applied thereto. In some cases, the heating is directly and primarily responsible for the transformation. In other cases, the heating primarily facilitates the diffusion or flux of lithium ions that creates the IC-functioning material region as described in the second mechanism.

Finally, in a fourth mechanism, current flowing between the EC and CE layers drives the transformation of at least one of the electrochromic material and the counter electrode material to the IC-functioning material in the interfacial region. This may occur because, for example, an ion flux associated with the flowing current is so large it drives a chemical transformation of EC and/or CE material to IC material in the interfacial region. For example, as explained below, a large lithium flux through tungsten oxide in an EC layer may produce lithium tungstate, which serves as an IC material. The lithium flux may be introduced during, for example, an initial activation cycle of a newly formed device. However, this need not be the case, as other opportunities for driving high ionic fluxes may be more appropriate for effecting the conversion. Methods of the invention can be performed by one of ordinary skill in the art without resort to any one or more of the above mechanisms.

Returning to the embodiment of FIG. 1A, examples of suitable materials for the lithium ion conductor layer include lithium silicate, lithium aluminum silicate, lithium oxide, lithium tungstate, lithium aluminum borate, lithium borate, lithium zirconium silicate, lithium niobate, lithium borosilicate, lithium phosphosilicate, lithium nitride, lithium oxynitride, lithium aluminum fluoride, lithium phosphorus oxynitride (LiPON), lithium lanthanum titanate (LLT), lithium tantalum oxide, lithium zirconium oxide, lithium silicon carbon oxynitride (LiSiCON), lithium titanium phosphate, lithium germanium vanadium oxide, lithium zinc germanium oxide, and other ceramic materials that allow lithium ions to pass through them while having a high electrical resistance (blocking electron movement therethrough). Any material, however, may be used for the ion conducting layer 108 provided it can be fabricated with low defectivity and it allows for the passage of ions between the counter electrode layer 110 to the electrochromic layer 106 while substantially preventing the passage of electrons.

In certain embodiments, the ion conducting layer is crystalline, amorphous, or a mixture thereof. Typically, the ion conducting layer is amorphous. In another embodiment, the ion conducting layer is nanocrystalline. In another embodiment, the ion conducting layer is a mixed amorphous and crystalline phase, where the crystalline phase is nanocrystalline.

The thickness of the ion conducting layer 108 may vary depending on the material. In some embodiments, the ion conducting layer 108 is about 5 nm to 100 nm thick, preferably about 10 nm to 60 nm thick. In some embodiments, the ion conducting layer is about 15 nm to 40 nm thick or about 25 nm to 30 nm thick. The thickness of the ion conducting layer is also substantially uniform.

Ions transported across the ion conducting layer between the electrochromic layer and the counter electrode layer serve to effect a color change in the electrochromic layer (i.e., change the electrochromic device from the clear state to the tinted state) when they reside in the electrochromic layer. For devices having anodically coloring counter electrode layers, the absence of these ions induces color in the counter electrode layer. Depending on the choice of materials for the electrochromic device stack, such ions include lithium ions ($Li^+$) and hydrogen ions ($H^+$) (i.e., protons). As mentioned above, other ions may be employed in certain embodiments. These include deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In certain embodiments, hydrogen ions are not used because side reactions during operation of the device cause recombination to hydrogen gas which may escape the device and degrade performance. Thus, ions that do not have this issue, for example lithium ions, may be used.

The electrochromic devices in embodiments herein are also scalable to substrates smaller or larger than architectural glass. An electrochromic stack can be deposited onto substrates that are a wide range of sizes, up to about 12 inches by 12 inches, or even 80 inches by 120 inches.

In some embodiments, electrochromic glass is integrated into an insulating glass unit (IGU). An insulating glass unit consists of multiple glass panes assembled into a unit, generally with the intention of maximizing the thermal insulating properties of a gas contained in the space formed by the unit while at the same time providing clear vision through the unit. Insulating glass units incorporating electrochromic glass would be similar to insulating glass units currently known in the art, except for electrical leads for connecting the electrochromic glass to voltage source. Due to the higher temperatures (due to absorption of radiant energy by an electrochromic glass) that electrochromic insulating glass units may experience, more robust sealants than those used in conventional insulating glass units may be necessary. For example, stainless steel spacer bars, high temperature polyisobutylene (PIB), new secondary sealants, foil coated PIB tape for spacer bar seams, and the like.

Heterogeneous Counter Electrode

As shown in FIG. 1A, the anodically coloring counter electrode may be a single homogeneous layer in some cases. However, in a number of embodiments herein, the anodically coloring counter electrode layer is heterogeneous in composition or a physical feature such as morphology. Such heterogeneous counter electrode layers may exhibit improved color, switching behavior, lifetime, uniformity, process window, etc. Heterogeneous counter electrodes are further discussed in U.S. Provisional Patent Application No. 62/192,443, which is herein incorporated by reference in its entirety.

In certain embodiments, the counter electrode layer includes two or more sublayers, where the sublayers have different compositions and/or morphologies. One or more of such sublayers may also have a graded composition. The composition and/or morphology gradient may have any form of transition including a linear transition, a sigmoidal transition, a Gaussian transition, etc. A number of advantages can be realized by providing the counter electrode as two or more sublayers. For instance, the sublayers may be different materials that have complimentary properties. One material may promote better color quality while another material promotes high quality, long lifetime switching behavior. The combination of materials may promote a high degree of film quality and uniformity while at the same time achieving a high rate of deposition (and therefore throughput). Some of the approaches outlined herein may also promote better control of the lithium distribution throughout the electrochromic device, and in some cases may lead to improvements in morphology in the counter electrode (e.g., higher transmission) and the overall reduction of defects in the electrochromic device. Another benefit that may result from various embodiments herein is the availability of one or more intermediate states. Differences in electrical potentials between various sublayers may allow for lithium to reside in discrete locations (e.g., within particular sublayers to particular degrees), thereby enabling the electrochromic device to achieve intermediate tint states between e.g., a fully tinted device and a fully clear device. In some cases, intermediate states can be achieved by applying different voltages to the device. The inclusion of multiple sub-layers within the counter electrode layer may reduce or eliminate the need to apply different voltages to achieve different intermediate tint states. These and other benefits of the disclosed embodiments are further described below.

In some cases, a counter electrode includes a first sublayer of a first anodically coloring counter electrode material and one or more additional sublayers of a second anodically coloring counter electrode material. In various cases, the first sublayer of the CE layer may be situated closer to the cathodically coloring electrochromic material than the second (and optional additional) sublayer(s) of the CE layer. In some implementations, the first sublayer is a flash layer, which is generally characterized as a thin and often quickly deposited layer typically having a thickness of not greater than about 50 nm. The flash layer, if present, may or may not exhibit electrochromic properties. In certain embodiments, the flash layer is made of a counter electrode material that does not change color with remaining electrochromic/counter electrode layers (though this layer may have a composition that is very similar to other layers such as an anodically coloring layer). In some embodiments, the first sublayer/flash layer has a relatively high electronic resistivity, for example between about 1 and $5 \times 10^{10}$ Ohm-cm.

Generally speaking, the first and second anodically coloring counter electrode materials may each, independently, be any anodically coloring counter electrode material. The first and/or second counter electrode materials may be binary metal oxides (e.g., oxides that include two metals in addition to lithium or other transported ion, NiWO being one example), ternary metal oxides (e.g., oxides that include three metals, NiWTaO being one example), or even more complex materials. In many cases the materials also include lithium, which to a certain extent may be mobile within the device.

In a particular example, the first anodically coloring material is NiWO. In these or other examples, the second anodically coloring material may be NiWO that is doped with or otherwise includes an additional metal (e.g., a non-alkali metal, a transition metal, a post-transition metal, or a metalloid in certain cases), with one example material being NiWTaO.

In some embodiments, the first and second anodically coloring materials contain the same elements, but in different proportions. For example, both materials may contain Ni, W, and Ta, but two or three of the elements may be present in different mass or atomic ratios. In some other embodiments, the first and second sublayers may be more significantly different from one another compositionally. For instance, the first and second sublayers (and any additional sublayers) may each be any anodically coloring material, regardless of the composition of the other sublayers.

The two or more sublayers may have different physical properties. In various cases, a material used in one or more of the sublayers is a material that would not perform well (e.g., would exhibit poor color quality, poor lifetime performance, slow switching speed, slow deposition rate, etc.) as a counter electrode material if provided without the accompanying sublayer(s).

Figure 1B:
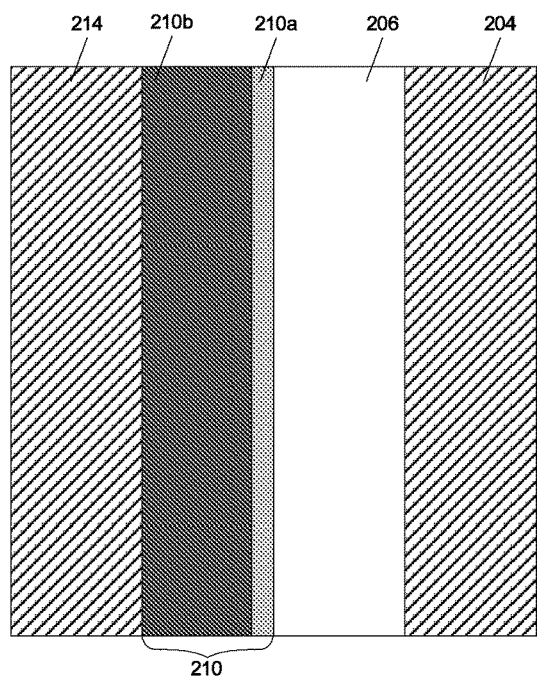

FIG. 1B provides a cross sectional view of an electrochromic stack, as deposited, according to one embodiment. The stack includes transparent conductive oxide layers 204 and 214. In contact with transparent conductive oxide layer 204 is a cathodically coloring electrochromic layer 206. In contact with transparent conductive oxide layer 214 is anodically coloring counter electrode layer 210, which includes two sublayers 210a and 210b. The first sublayer 210a of the counter electrode is in contact with the electrochromic layer 206, and the second sublayer 210b is in contact with the transparent conductive oxide layer 214. In this embodiment, no separate ion conductor layer is deposited (though an interfacial region serving as an ion conductor layer may be formed in situ from this construct as described in U.S. patent application Ser. No. 13/462,725, filed May 2, 2012, and titled "ELECTROCHROMIC DEVICES," which is herein incorporated by reference in its entirety).

The first and second sublayers 210a and 210b of the anodically coloring counter electrode layer 210 may have different compositions and/or morphologies. In various examples, the second sublayer 210b includes at least one metal and/or metal oxide that is not present in the first sublayer 210a. In a particular example, the first sublayer 210a is NiWO and the second sublayer 210b is NiWO doped or otherwise combined with another metal (e.g., NiWTaO, NiWSnO, NiWNbO, NiWZrO, etc.). In another embodiment, the first and second sublayers 210a and 210b include the same elements at different relative concentrations.

In some embodiments, the first sublayer 210a is a flash layer. Flash layers are typically thin layers (and as such they are typically, but not necessarily, deposited relatively quickly). In some embodiments, a first sublayer of an anodically coloring counter electrode is a flash layer that is between about 10-100 nm thick, for example between about 20-50 nm thick. In a number of embodiments, the first sublayer/flash layer may be a material that deposits at a higher deposition rate than the material of the remaining sublayers. Similarly, the flash layer may be deposited at a lower power than the remaining sublayers. The remaining sublayer(s) may be thicker than the first sublayer 210a in many embodiments. In certain embodiments where the counter electrode layer 210 includes two sublayers such as 210a and 210b, the second sublayer 210b may be between about 20-300 nm thick, for example between about 150-250 nm thick.

In certain embodiments, the second sublayer 210b is homogeneous with respect to composition. FIG. 1D presents a graph showing the concentration of various elements present in the first and second sublayers 210a and 210b of FIG. 1B in a particular embodiment where the first sublayer is NiM1O and the second sublayer is compositionally homogeneous NiM1M2O. The first sublayer 210a is labeled CE1 and the second sublayer 210b is labeled CE2. In this example, the first sublayer has a composition that is about 25% nickel, about 8% M1, and about 66% oxygen, and the second sublayer has a composition that is about 21% nickel, about 3% M1, about 68% oxygen, and about 8% M2. M2 may be a metal in various embodiments.

In other embodiments, the second sublayer 210b may include a graded composition. The composition may be graded with respect to the relative concentration of a metal therein. For instance, in some cases the second sublayer 210b has a graded composition with respect to a metal that is not present in the first sublayer. In one particular example, the first sublayer is NiWO and the second sublayer is NiWTaO, where the concentration of tantalum is graded throughout the second sublayer. The relative concentrations of the remaining elements (excluding the tantalum) may be uniform throughout the second sublayer, or they may also change throughout this sublayer. In a particular example, the concentration of oxygen may also be graded within the second sublayer 210b (and/or within the first sublayer 210a).

Figure 1C:
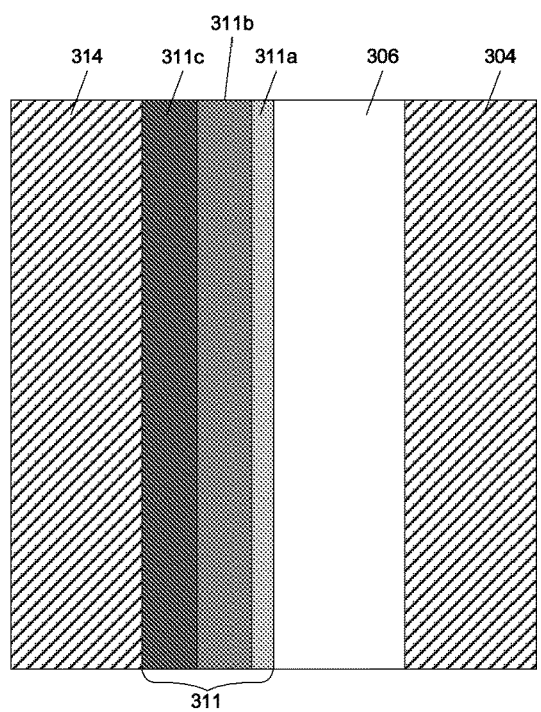
Figure 1D:
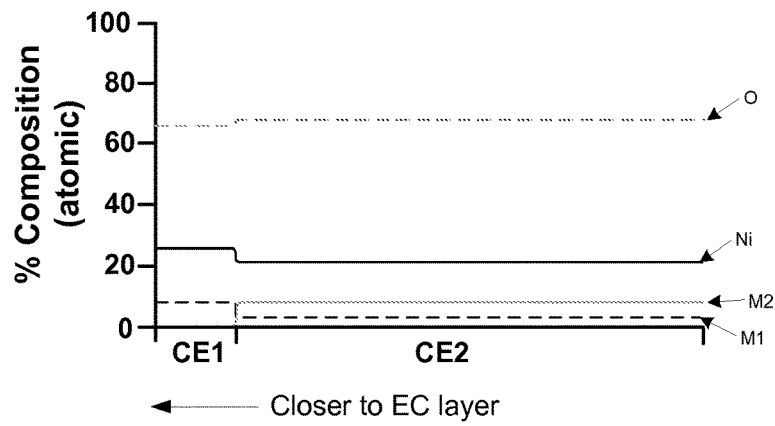
FIGS. 1D-1G are graphs describing the composition of a heterogeneous counter electrode layer in accordance with certain embodiments.
Figure 1E:
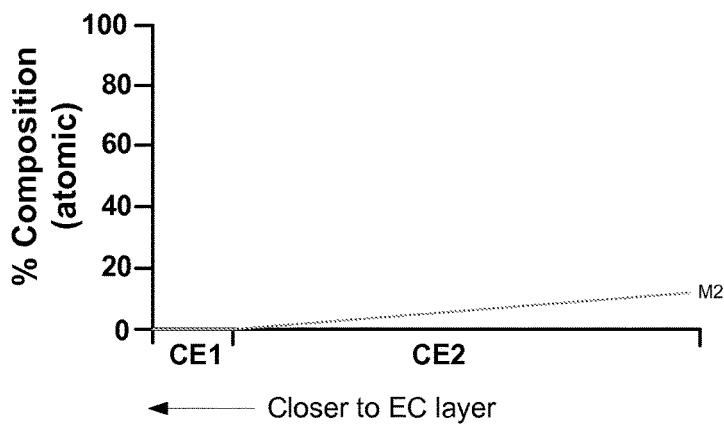

FIG. 1E presents a graph showing the concentration of M2 present in the first and second sublayers 210a and 210b of FIG. 1B in a particular embodiment where the first sublayer is NiM1O and the second sublayer is a graded layer of NiM1M2O. As with FIG. 1D, the first sublayer 210a is labeled CE1 and the second sublayer is labeled CE2. In this example, the concentration of M2 rises throughout the second sublayer, to a value of about 15% (atomic). The other elements are omitted from the figure; though in one embodiment, they reflect the compositions substantially as described in relation to FIG. 1D, adjusted as appropriate to accommodate the changing M2 concentration.

Figure 1F:
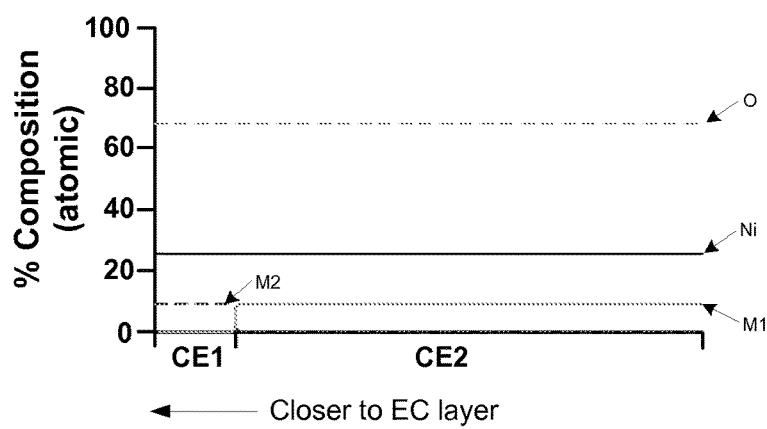

In certain embodiments, the first and second sublayers may have compositions that are more different from one another. FIG. 1F presents a graph showing the concentration of various elements present in the first and second sublayers 210a and 210b of FIG. 1B in an embodiment where the first sublayer is NiM1O and the second sublayer is NiM2O. In a particular case, M1 is tungsten and M2 is vanadium, though other metals and materials may also be used. While FIG. 4C shows the concentration of oxygen and nickel remaining constant throughout both sublayers of the counter electrode layer, this is not always the case. The particular compositions described with respect to FIGS. 1D-1F are merely provided as examples and are not intended to be limiting. Different materials and concentrations/compositions may also be used.

FIG. 1C shows an additional example of an electrochromic stack similar to that shown in FIG. 1B. The stack in FIG. 1C includes transparent conductive oxide layers 304 and 314, cathodically coloring electrochromic layer 306, and anodically coloring counter electrode layer 311. Here, counter electrode layer 311 is made of three sublayers 311a-c. The first sublayer 311a may be a flash layer as described above with respect to the first sublayer 210a of FIG. 1B. Each of the sublayers 311a-c may have a different composition. The second and third sublayers 311b and 311c may include the same elements at different relative concentrations in some embodiments. In another embodiment, all of the sublayers 311a-c include the same elements at different relative concentrations.

In some embodiments, additional sublayers may be provided. The additional sublayers may be homogeneous with respect to composition, or they may be graded as described above. The trends described with relation to the first, second, and third sublayers of FIGS. 1B and 1C may also hold true in throughout additional sublayers in various embodiments where such additional sublayers are provided. In one example, the counter electrode is deposited to include four sublayers, where the first sublayer (positioned closest to the electrochromic layer) includes a first material (e.g., NiM1O) and the second, third, and fourth sublayers include a second material (e.g., NiM1M2O) that includes an additional element (e.g., a metal) that is not present in the first sublayer. The concentration of this additional element may be higher in sublayers that are farther away from the electrochromic layer and lower in sublayers that are closer to the electrochromic layer. As one particular example, the first sublayer (closest to the electrochromic layer) is NiWO, the second sublayer is NiWTaO with 3% (atomic) Ta, the third sublayer is NiWTaO with 7% (atomic) Ta, and the fourth sublayer (farthest from the electrochromic layer) is NiWTaO with 10% (atomic) Ta.

Figure 1G:
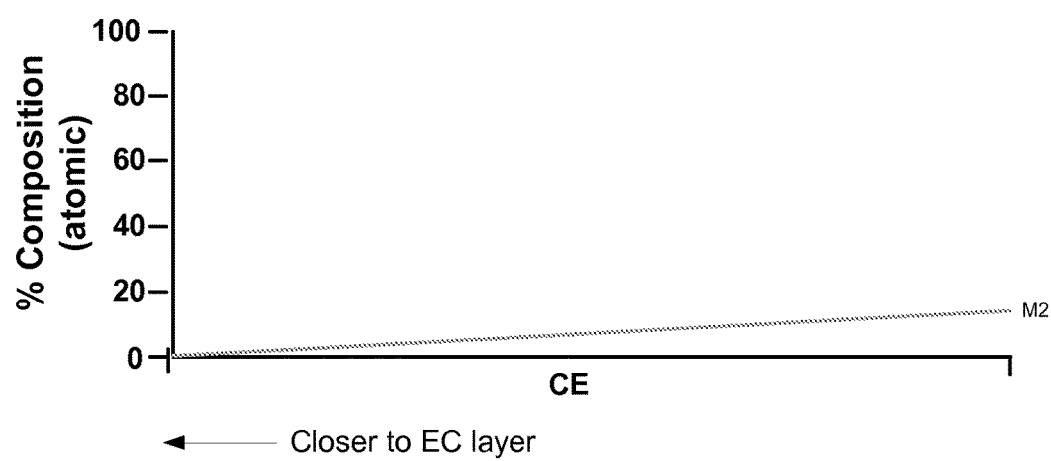

In still another embodiment, the counter electrode may be provided as a single layer, but the composition of the counter electrode layer may be graded. The composition may be graded with respect to one or more elements present in the material. In some embodiments, the counter electrode has a graded composition with respect to one or more metals in the material. In these or other embodiments, the counter electrode may have a graded composition with respect to one or more non-metals, for example oxygen. FIG. 1G presents a graph showing the concentration of M2 present in a counter electrode layer where the counter electrode is provided as a single layer with a graded composition. In this example, the composition is graded with respect to a metal therein (M2). The other elements (Ni, M1, O) are omitted from FIG. 1G. In one embodiment, these elements reflect the compositions substantially as described in relation to FIG. 1D or 1F, adjusted as appropriate to accommodate the changing M2 composition.

Without wishing to be bound by theory or mechanism of action, it is believed that the disclosed first sublayer may help protect the ion conducting layer and/or electrochromic layer from damage arising from excessive heating or other harsh condition during deposition of the counter electrode layer. The first sublayer may be deposited under conditions that are milder than those used to deposit the remaining sublayers. For instance, in some embodiments, the first sublayer may be deposited at a sputter power between about 5-20 kW/m$^2$, and the second sublayer may be deposited at a sputter power between about 20-45 kW/m$^2$. In one particular example where the first sublayer is NiWO and the second sublayer is NiWTaO, the NiWTaO may be deposited using higher sputtering power than the NiWO. This high power process, if performed to deposit directly on the ion conducting and/or electrochromic layer, might in some implementations degrade the ion conducting and/or electrochromic layer, for example due to excessive heating and premature crystallization of the relevant materials, and/or due to loss of oxygen in the ion conducting and/or electrochromic layer. However, where a thin flash layer of NiWO is provided as a first sublayer, this NiWO layer can be deposited under more gentle conditions. The NiWO sublayer may then protect the underlying ion conducting and/or electrochromic layer during deposition of subsequent NiWTaO sublayer(s). This protection may lead to a more reliable, better functioning electrochromic device.

The disclosed embodiments may also exhibit improved performance arising from higher quality morphology and improved morphology control within the anodically coloring materials. For example, by providing the counter electrode as two or more sublayers, one or more additional interfaces are introduced within the counter electrode (e.g., interfaces where the sublayers contact one another). These interfaces can disrupt the formation of crystals, for example due to renucleation and related grain growth effects. Such effects may act to prevent the crystals from growing larger and limit the size of any crystals that form. This effect on morphology may lead to fabrication of devices with fewer voids or other defects.

Without wishing to be bound by theory or mechanism of action, it is also believed that the disclosed methods may be used to achieve improved control over the distribution of lithium within an electrochromic device. Different counter electrode materials exhibit different affinities for lithium, and therefore the choice of counter electrode material(s) affects how the lithium ions are distributed in an electrochromic device. By selecting particular materials and combinations of materials, the distribution of lithium within the device can be controlled. In certain embodiments, the sublayers of the counter electrode include materials having different affinities for lithium. For instance, the material of the first sublayer may have a higher or lower affinity for lithium compared to the material of the second (or additional) sublayer(s) of the counter electrode.

Relatedly, the disclosed methods may be used to achieve improved control over the total amount of lithium used to fabricate an electrochromic device. In various cases, lithium may be added during deposition of the counter electrode layer. In some embodiments, lithium may be added during deposition of one or more sublayers of the counter electrode. In these or other embodiments, lithium may be added between depositions of subsequent sublayers of the counter electrode. By controlling the distribution of lithium and the total amount of lithium within the electrochromic device, device uniformity and appearance may be improved.

Another benefit that may arise with the disclosed techniques is improved color and switching performance. As mentioned above, certain counter electrode materials exhibit better performance in terms of color (e.g., clearer clear states, more attractive tinted states, etc.), switching speed, lifetime, and other properties. However, certain materials that promote high quality results with respect to one property may have drawbacks with respect to other properties. For instance, a material that is desirable because it exhibits a very transparent and uncolored clear state may suffer problems related to slow switching speed and/or short lifetime. By combining this material with another counter electrode material (which may have its own problems such as a relatively more yellow clear state), it is possible in various implementations to achieve a counter electrode with improved properties. The drawbacks related to one counter electrode material may be mitigated by properties of another counter electrode material.

Method of Fabricating Electrochromic Windows

Deposition of the Electrochromic Stack

As mentioned above, one aspect of the embodiments is a method of fabricating an electrochromic window. In a broad sense, the method includes sequentially depositing on a substrate (i) a cathodically coloring electrochromic layer, (ii) an optional ion conducting layer, and (iii) an anodically coloring counter electrode layer to form a stack in which the ion conducting layer separates the cathodically coloring electrochromic layer and the anodically coloring counter electrode layer. The sequential deposition employs a single integrated deposition system having a controlled ambient environment in which the pressure, temperature, and/or gas composition are controlled independently of an external environment outside of the integrated deposition system, and the substrate does not leave the integrated deposition system at any time during the sequential deposition of the electrochromic layer, the ion conducting layer, and the counter electrode layer. (Examples of integrated deposition systems which maintain controlled ambient environments are described in more detail below in relation to FIGS. 5A-E.) The gas composition may be characterized by the partial pressures of the various components in the controlled ambient environment. The controlled ambient environment also may be characterized in terms of the number of particles or particle densities. In certain embodiments, the controlled ambient environment contains fewer than 350 particles (of size 0.1 micrometers or larger) per m$^3$. In certain embodiments, the controlled ambient environment meets the requirements of a class 1000 clean room (US FED STD 209E), or a class 100 clean room (US FED STD 209E). In certain embodiments, the controlled ambient environment meets the requirements of a class 10 clean room (US FED STD 209E). The substrate may enter and/or leave the controlled ambient environment in a clean room meeting class 1000, class 100 or even class 10 requirements.

Typically, but not necessarily, this method of fabrication is integrated into a multistep process for making an electrochromic window using architectural glass as the substrate. For convenience, the following description contemplates the method and its various embodiments in the context of a multistep process for fabricating an electrochromic window, but methods are not so limited. Electrochromic mirrors and other devices may be fabricated using some or all of the operations and approaches described herein.

Figure 2:
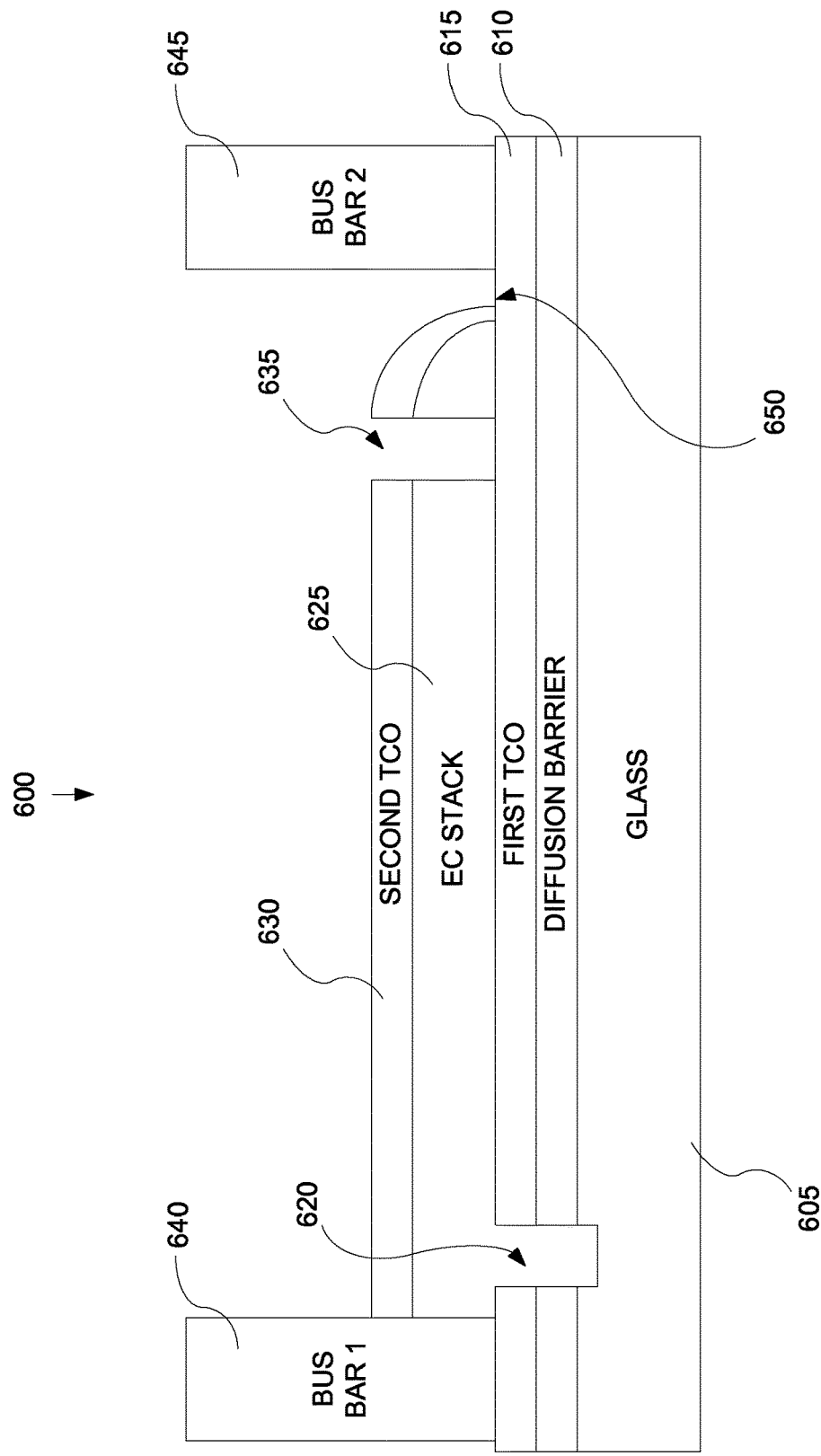
FIG. 2 depicts a cross-sectional representation of an electrochromic window device in accord with the multistep process description provided in relation to FIG. 4A.
Figure 3:
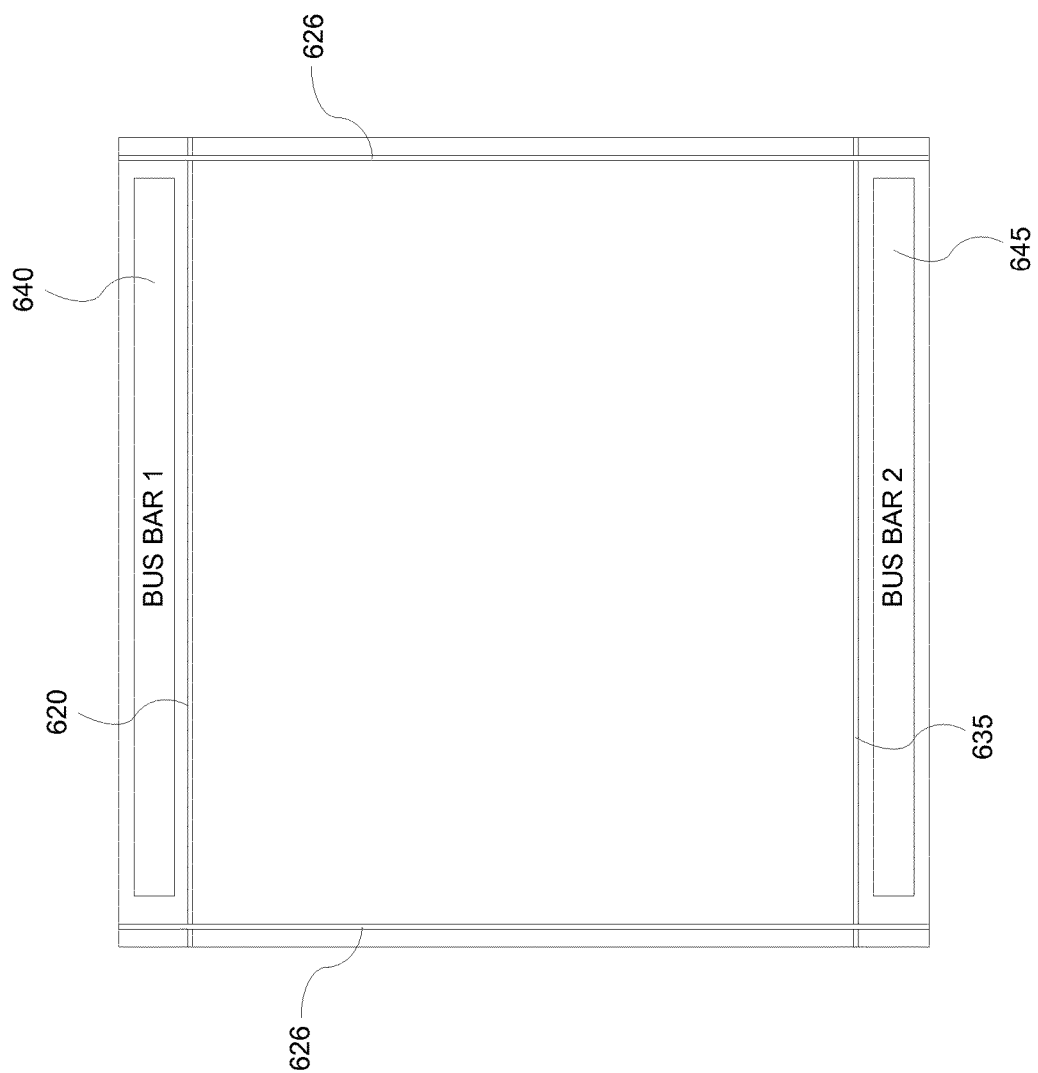
FIG. 3 depicts a top view of an electrochromic device showing location of trenches cut into the device.
Figure 4A:
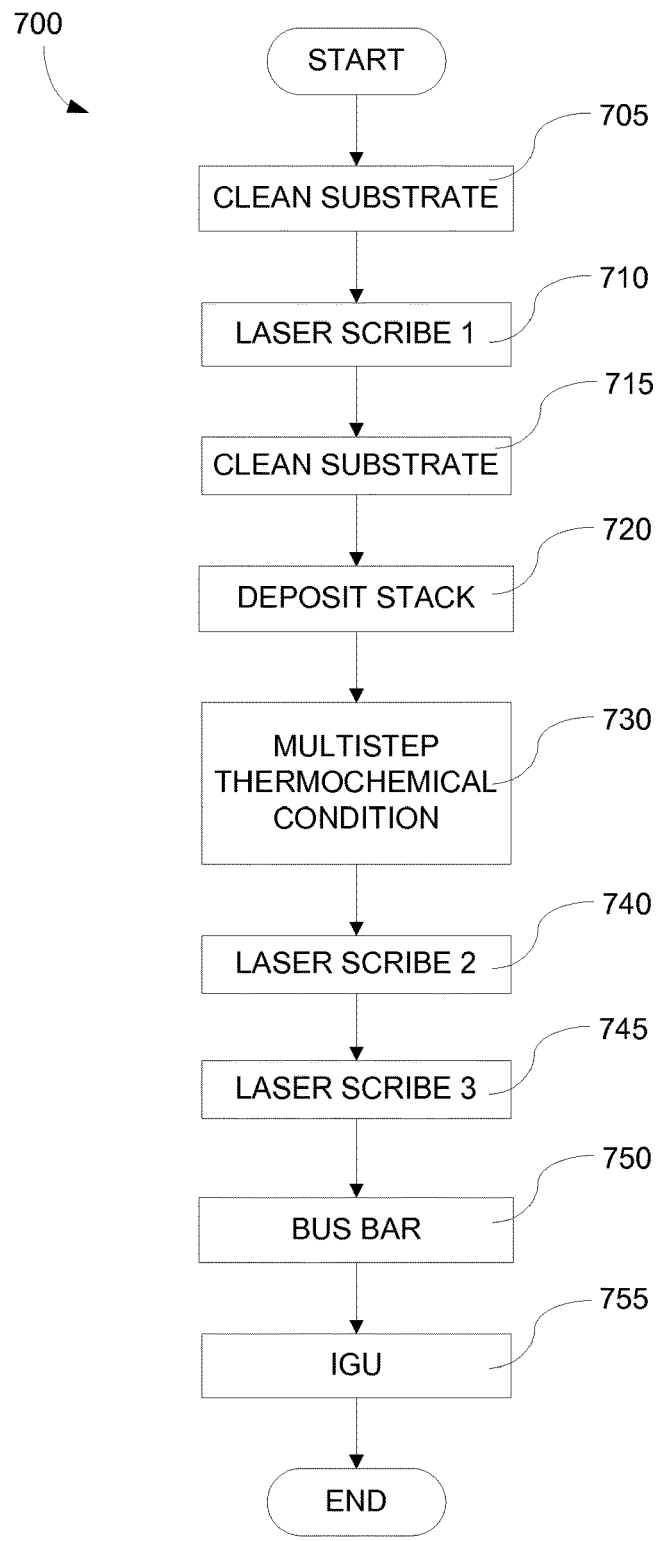
FIG. 4A depicts a process flow describing a method of fabricating an electrochromic window.
Figure 4B:
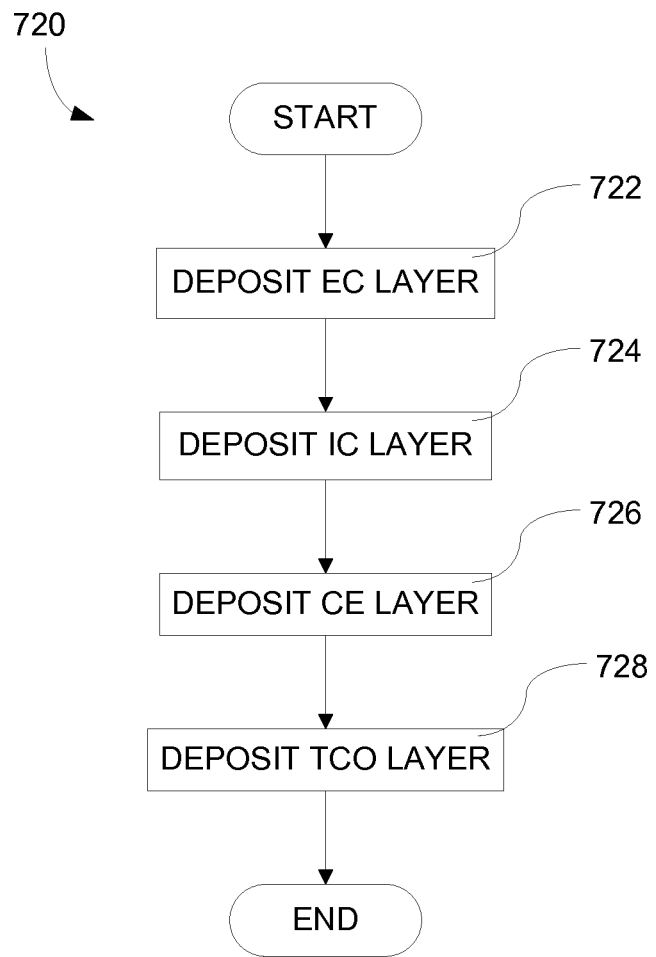
FIGS. 4B-4D depict methods of fabricating an electrochromic stack which is part of an electrochromic device according to certain embodiments.
Figure 4C:
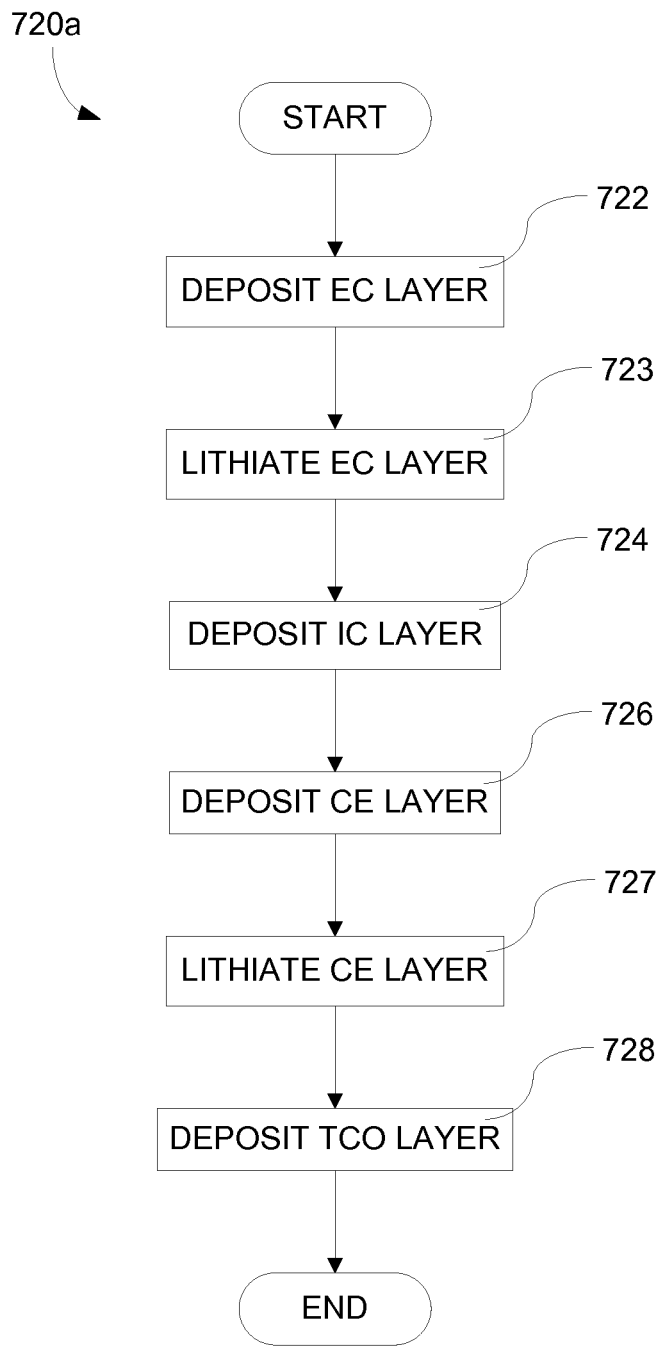
Figure 4D:
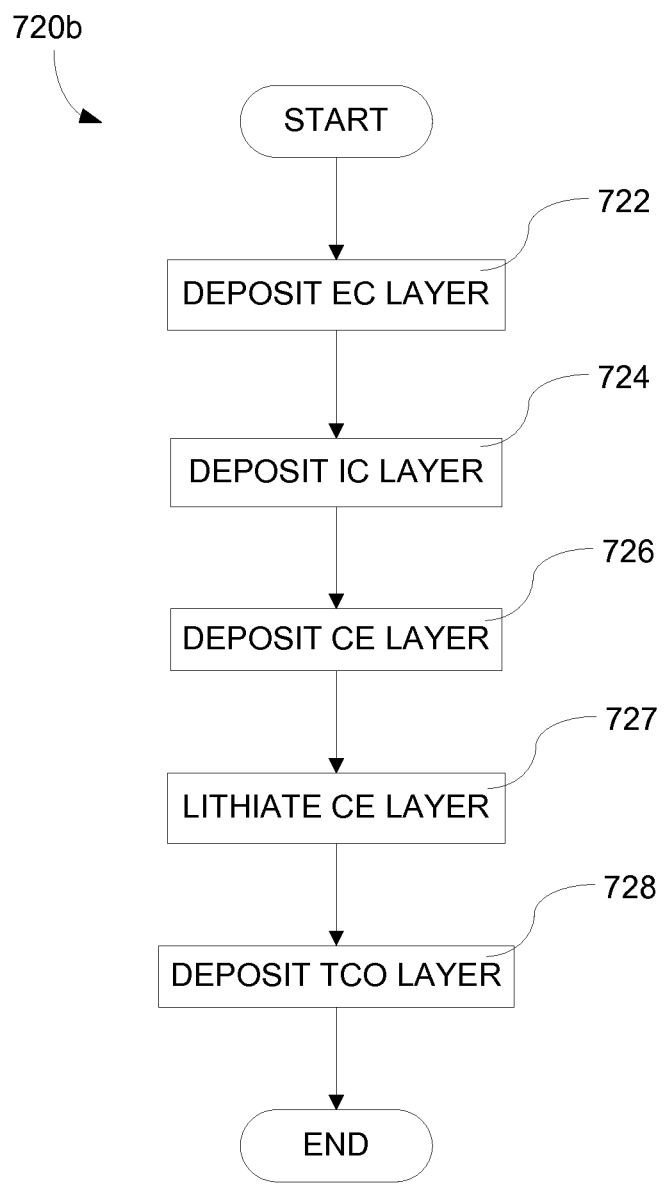
Figure 4E:
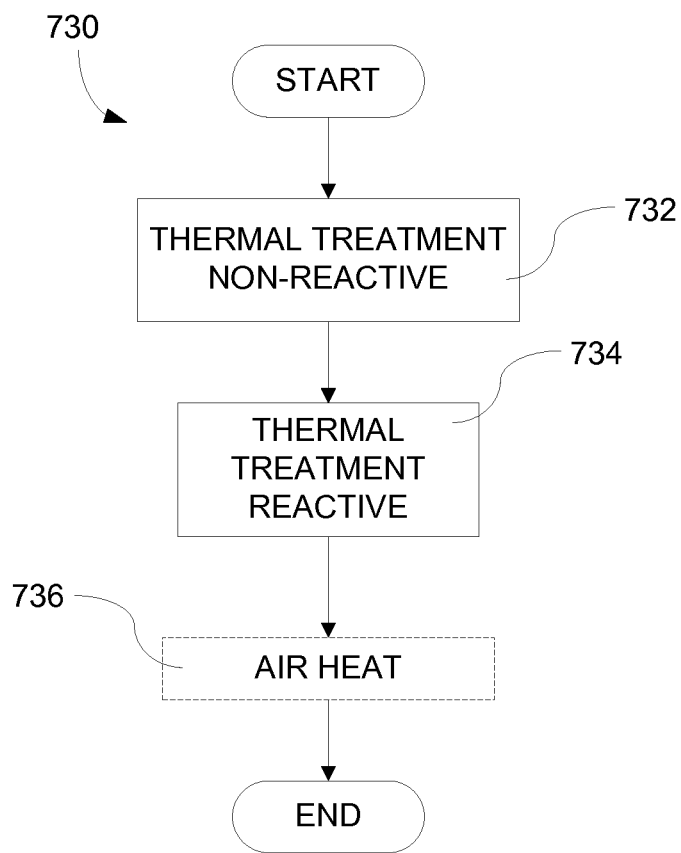
FIG. 4E depicts a process flow for a conditioning process used to fabricate an electrochromic device according to certain embodiments.

FIG. 2 is a cross-sectional representation of an electrochromic window device, 600, in accord with a multistep process such as that described in relation to FIG. 4A. FIG. 4A depicts a process flow describing a method, 700, of fabricating an electrochromic window which incorporates electrochromic device 600. FIG. 3 is a top view of device 600 showing the location of trenches cut into the device. Thus, FIGS. 2, 3, and 4A will be described together. One aspect of the description is an electrochromic window including device 600 and another aspect of the description is a method, 700, of fabricating an electrochromic window which includes device 600. Included in the following description are descriptions of FIGS. 4B-4E. FIGS. 4B-4D depict specific methods of fabricating an electrochromic stack which is part of device 600. FIG. 4E depicts a process flow for a conditioning process used in fabricating, e.g., device 600.

FIG. 2 shows a specific example of an electrochromic device, 600, which is fabricated starting with a substrate made of glass 605 which optionally has a diffusion barrier 610 coating and a first transparent conducting oxide (TCO) coating 615 on the diffusion barrier. Method 700 employs a substrate that is, for example, float glass with sodium diffusion barrier and antireflective layers followed by a transparent conductive layer, for example a transparent conductive oxide 615. As mentioned above, substrates suitable for devices include glasses sold under the trademarks TEC Glass® by Pilkington of Toledo, Ohio, and SUN-GATE® 300 and SUNGATE® 500 by PPG Industries, of Pittsburgh, Pa. The first TCO layer 615 is the first of two conductive layers used to form the electrodes of electrochromic device 600 fabricated on the substrate.

Method 700 begins with a cleaning process, 705, where the substrate is cleaned to prepare it for subsequent processing. As mentioned above, it is important to remove contaminants from the substrate because they can cause defects in the device fabricated on the substrate. One critical defect is a particle or other contaminant that creates a conductive pathway across the IC layer and thus shorts the device locally causing visually discernable anomalies in the electrochromic window. One example of a cleaning process and apparatus suitable for the fabrication methods herein is Lisec™ (a trade name for a glass washing apparatus and process available from (LISEC Maschinenbau Gmbh of Seitenstetten, Austria).

Cleaning the substrate may include mechanical scrubbing as well as sonication conditioning to remove unwanted particulates. As mentioned, particulates may lead to cosmetic flaws as well as local shorting within the device.

Once the substrate is cleaned, a first laser scribe process, 710, is performed in order to remove a line of the first TCO layer on the substrate. In one embodiment, the resulting trench ablates through both the TCO and the diffusion barrier (although in some cases the diffusion barrier is not substantially penetrated). FIG. 2 depicts this first laser scribe trench, 620. A trench is scribed in the substrate across the entire length of one side of the substrate in order to isolate an area of the TCO, near one edge of the substrate, which will ultimately make contact with a first bus bar, 640, used to provide current to a second TCO layer, 630, which is deposited on top of electrochromic (EC) stack 625 (which includes the electrochromic, ion conducting and counter electrode layers as described above). FIG. 3 shows schematically (not to scale) the location of trench 620. In the depicted embodiment, the non-isolated (main) portion of the first TCO layer, on the diffusion barrier, ultimately makes contact with a second bus bar, 645. Isolation trench 620 may be needed because, in certain embodiments, the method of attaching the first bus bar to the device includes pressing it through the device stack layers after they are laid down (both on the isolated portion of the first TCO layer and the main portion of the first TCO layer). Those of skill in the art will recognize that other arrangements are possible for providing current to the electrodes, in this case TCO layers, in the electrochromic device. The TCO area isolated by the first laser scribe is typically an area along one edge of the substrate that will ultimately, along with the bus bars, be hidden when incorporated into the integrated glass unit (IGU) and/or window pane, frame or curtain wall. The laser or lasers used for the first laser scribe are typically, but not necessarily, pulse-type lasers, for example diode-pumped solid state lasers. For example, the laser scribes can be performed using a suitable laser from IPG Photonics (of Oxford Mass.), or from Ekspla (of Vilnius Lithuania).

The laser trench is dug along a side of the substrate from end to end to isolate a portion of the first TCO layer; the depth and width dimensions of trench 620 made via first laser scribe 710 should be sufficient to isolate the first TCO layer from the bulk TCO once the device is subsequently deposited. The depth and width of the trench should be sufficient to prevent any remaining particulates to short across the trench. In one embodiment, the trench is between about 300 nm and 900 nm deep (e.g., between about 300 nm and 500 nm) and between about 20 μm and 50 μm wide. In another embodiment, the trench is between about 350 nm and 450 nm deep and between about 30 μm and 45 μm wide. In another embodiment, the trench is about 400 nm deep and about 40 μm wide.

After the first laser scribe 710, the substrate is cleaned again (operation 715), typically but not necessarily, using cleaning methods described above. This second cleaning process is performed to remove any debris caused by the first laser scribe. Once cleaning operation 715 is complete, the substrate is ready for deposition of EC stack 625. This is depicted in process flow 700 as process 720. As mentioned above, the method includes sequentially depositing on a substrate (i) a cathodically coloring EC layer, (ii) an optional IC layer, and (iii) an anodically coloring CE layer (e.g., NiWTaO in various embodiments) to form a stack in which the IC layer separates the EC layer and the CE layer using a single integrated deposition system having a controlled ambient environment in which the pressure and/or gas composition are controlled independently of an external environment outside of the integrated deposition system, and the substrate does not leave the integrated deposition system at any time during the sequential deposition of the EC layer, the IC layer, and the CE layer. In one embodiment, each of the sequentially deposited layers is physical vapor deposited. In general the layers of the electrochromic device may be deposited by various techniques including physical vapor deposition, chemical vapor deposition, plasma enhanced chemical vapor deposition, and atomic layer deposition, to name a few. The term physical vapor deposition as used herein includes the full range of art understood PVD techniques including sputtering, evaporation, ablation, and the like. FIG. 4B depicts one embodiment of process 720. First the cathodically coloring EC layer is deposited on the substrate, process 722, then the IC layer is deposited, process 724 (as noted above, in certain embodiments the IC layer, and therefore process 724, are omitted), then the anodically coloring CE layer, process 726. The reverse order of deposition is also an embodiment, that is, where the CE layer is deposited first, then the optional IC layer and then the EC layer. In one embodiment, each of the electrochromic layer, the optional ion conducting layer, and the counter electrode layer is a solid phase layer. In another embodiment, each of the electrochromic layer, the optional ion conducting layer, and the counter electrode layer includes only inorganic material.

It should be understood that while certain embodiments are described in terms of a counter electrode layer, an ion conductor layer, and an electrochromic layer, any one or more of these layers may be composed of one or more sub-layers, which may have distinct compositions, sizes, morphologies, charge densities, optical properties, etc. Further any one or more of the device layers may have a graded composition or a graded morphology in which the composition or morphology, respectively, changes over at least a portion of the thickness of the layer. In one example, the concentration of oxygen, a dopant, or charge carrier varies within a given layer, at least as the layer is fabricated. In another example, the morphology of a layer varies from crystalline to amorphous. Such graded composition or morphology may be chosen to impact the functional properties of the device. In some cases, additional layers may be added to the stack. In one example a heat spreader layer is interposed between one or both TCO layers and the EC stack.

Also, as described above, the electrochromic devices of certain embodiments utilize ion movement between the electrochromic layer and the counter electrode layer via an ion conducting layer. In some embodiments these ions (or neutral precursors thereof) are introduced to the stack as one or more layers (as described below in more detail in relation to FIGS. 4C and 4D) that eventually intercalate into the stack. In some embodiments these ions are introduced into the stack concurrently with one or more of the electrochromic layer, the ion conducting layer, and the counter electrode layer. In one embodiment, where lithium ions are used, lithium is, e.g., sputtered along with the material used to make the one or more of the stack layers or sputtered as part of a material that includes lithium (e.g., by a method employing lithium nickel tungsten tantalum oxide). In one embodiment, the IC layer is deposited via sputtering a lithium silicon aluminum oxide target. In another embodiment, the Li is cosputtered along with silicon aluminum in order to achieve the desired film.

Referring again to process 722 in FIG. 4B, in one embodiment, depositing the electrochromic layer comprises depositing $WO_x$, e.g. where x is less than 3.0 and at least about 2.7. In this embodiment, the $WO_x$ has a substantially nanocrystalline morphology. In some embodiments, the electrochromic layer is deposited to a thickness of between about 200 nm and 700 nm. In one embodiment, depositing the electrochromic layer includes sputtering tungsten from a tungsten containing target. Particular deposition conditions for forming a $WO_x$ electrochromic layer are further discussed in U.S. patent application Ser. No. 12/645,111, which is herein incorporated by reference in its entirety.

It should be understood that while deposition of the EC layer is described in terms of sputtering from a target, other deposition techniques are employed in some embodiments. For example, chemical vapor deposition, atomic layer deposition, and the like may be employed. Each of these techniques, along with PVD, has its own form of material source as is known to those of skill in the art.

Referring again to FIG. 4B, operation 724, once the EC layer is deposited, the IC layer is deposited. In one embodiment, depositing the ion conducting layer includes depositing a material selected from the group consisting of a tungsten oxide, a tantalum oxide, a niobium oxide, and a silicon aluminum oxide. Particular deposition conditions for forming an IC layer are further discussed in U.S. patent application Ser. No. 12/645,111, which is incorporated by reference above. In certain embodiments, depositing the ion conducting layer includes depositing the ion conducting layer to a thickness of between about 10 and 100 nm. As noted elsewhere herein, the IC layer may be omitted in certain embodiments.

Referring again to FIG. 4B, operation 726, after the IC layer is deposited, the anodically coloring CE layer is deposited. In one embodiment, depositing the counter electrode layer includes depositing a layer of nickel tungsten tantalum oxide (NiWTaO). In a specific embodiment, depositing the counter electrode layer includes sputtering a target including about 30% (by weight) to about 70% of tungsten in nickel and/or tantalum in an oxygen containing environment to produce a layer of nickel tungsten tantalum oxide (the tantalum being provided by a tungsten/nickel/tantalum target at an appropriate composition, or by another target, or through another source such as an evaporated tantalum source). In another embodiment the target is between about 40% and about 60% tungsten in nickel (and/or tantalum), in another embodiment between about 45% and about 55% tungsten in nickel (and/or tantalum), and in yet another embodiment about 51% tungsten in nickel (and/or tantalum).

In certain embodiments where the anodically coloring counter electrode layer includes NiWTaO, many deposition targets or combinations of targets may be used. For instance, individual metal targets of nickel, tungsten, and tantalum can be used. In other cases at least one of the targets includes an alloy. For instance, an alloy target of nickel-tungsten can be used together with a metal tantalum target. In another case, an alloy target of nickel-tantalum can be used together with a metal tungsten target. In a further case, an alloy of tungsten-tantalum can be used together with a metal nickel target. In yet a further case, an alloy target containing a nickel-tungsten-tantalum material may be used. Moreover, any of the listed targets can be provided as an oxide. Oftentimes, sputtering occurs in the presence of oxygen, and such oxygen is incorporated into the material. Sputter targets containing oxygen may be used alternatively or in addition to an oxygen-containing sputtering atmosphere.

The sputtering target(s) for forming the anodically coloring counter electrode material may have compositions that permit the counter electrode to be formed at any of the compositions described herein. In one example where a single sputter target is used, the sputter target may have a composition that matches the composition of any of the NiWTaO materials disclosed herein. In other examples a combination of sputter targets are used, and the composition of the combined targets allows for deposition at any of the NiWTaO materials disclosed herein. Further, the sputter targets may be arranged in any way that permits the material to be deposited as desired, as discussed further below.

In one embodiment, the gas composition used when forming the CE contains between about 30% and about 100% oxygen, in another embodiment between about 80% and about 100% oxygen, in yet another embodiment between about 95% and about 100% oxygen, in another embodiment about 100% oxygen. In one embodiment, the power density used to sputter the CE target is between about 2 Watts/cm$^2$ and about 50 Watts/cm$^2$ (determined based on the power applied divided by the surface area of the target); in another embodiment between about 5 Watts/cm$^2$ and about 20 Watts/cm$^2$; and in yet another embodiment between about 8 Watts/cm$^2$ and about 10 Watts/cm$^2$, in another embodiment about 8 Watts/cm$^2$. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 20 kHz and about 50 kHz, in yet another embodiment between about 40 kHz and about 50 kHz, in another embodiment about 40 kHz.

The pressure in the deposition station or chamber, in one embodiment, is between about 1 and about 50 mTorr, in another embodiment between about 20 and about 40 mTorr, in another embodiment between about 25 and about 35 mTorr, in another embodiment about 30 mTorr. In some cases, a nickel tungsten oxide NiWO ceramic target is sputtered with, e.g., argon and oxygen. In one embodiment, the NiWO is between about 15% (atomic) Ni and about 60% Ni; between about 10% W and about 40% W; and between about 30% O and about 75% O. In another embodiment, the NiWO is between about 30% (atomic) Ni and about 45% Ni; between about 10% W and about 25% W; and between about 35% O and about 50% O. In one embodiment, the NiWO is about 42% (atomic) Ni, about 14% W, and about 44% O. In another embodiment, depositing the counter electrode layer includes depositing the counter electrode layer to a thickness of between about 150 and 350 nm; in yet another embodiment between about 200 and about 250 nm thick. The above conditions may be used in any combination with one another to effect deposition of a high quality NiWTaO layer.

The sputtering process for forming the CE layer may utilize one or more sputter targets. In one example where one sputter target is used, the target may include nickel, tungsten, and tantalum. In some cases the sputter target also includes oxygen. The sputter target may include a grid or other overlapping shape where different portions of the grid include the different relevant materials (e.g., certain portions of the grid may include elemental nickel, elemental tungsten, elemental tantalum, a nickel-tungsten alloy, a nickel-tantalum alloy, and/or a tungsten-tantalum alloy). In some cases, a sputter target may be an alloy of the relevant materials (e.g., two or more of nickel, tungsten, and tantalum). Where two or more sputter targets are used, each sputter target may include at least one of the relevant materials (e.g., elemental and/or alloy forms of nickel, tungsten, and/or tantalum, any of which can be provided in oxide form). The sputter targets may overlap in some cases. The sputter targets may also rotate in some embodiments. As noted, the counter electrode layer is typically an oxide material. Oxygen may be provided as a part of the sputter target and/or sputter gas. In certain cases, the sputter targets are substantially pure metals, and sputtering is done in the presence of oxygen to form the oxide.

In one embodiment, in order to normalize the rate of deposition of the CE layer, multiple targets are used so as to obviate the need for inappropriately high power (or other inappropriate adjustment to desired process conditions) to increase deposition rate. In one embodiment, the distance between the CE target (cathode or source) to the substrate surface is between about 35 mm and about 150 mm; in another embodiment between about 45 mm and about 130 mm; and in another embodiment between about 70 mm and about 100 mm.

Figure 6A:
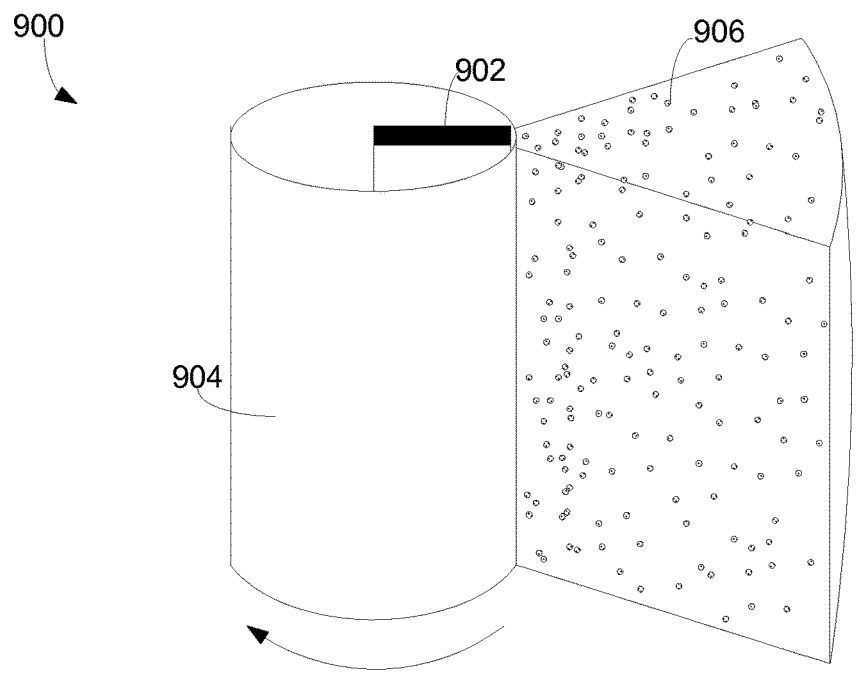
FIG. 6A illustrates a rotating sputter target according to certain embodiments.

As noted, one or more rotating targets may be used in some cases. In various cases, a rotating target may include an interior magnet. FIG. 6A presents a view of a rotating target 900. Inside the rotating target 900 is a magnet 902, which (when the target is supplied with appropriate power) causes material to sputter off of the target surface 904 in a sputter cone 906 (sputter cones are also sometimes referred to as sputter plasmas). The magnet 902 may extend along the length of the sputter target 900. In various embodiments, the magnet 902 may be oriented to extend radially outward such that the resulting sputter cone 906 emanates from the sputter target 900 in a direction normal to the target's surface 904 (the direction being measured along a central axis of the sputter cone 906, which typically corresponds to the average direction of the sputter cone 906). The sputter cone 906 may be v-shaped when viewed from above, and may extend along the height of the target 900 (or the height of the magnet 902 if not the same as the height of the target 900). The magnet 902 inside the rotating target 900 may be fixed (i.e., though the surface 904 of the target 900 rotates, the magnet 902 within the target 900 does not rotate) such that the sputter cone 906 is also fixed. The small circles/dots depicted in the sputter cone 906 represent sputtered material that emanates from the sputter target 900. Rotating targets may be combined with other rotating targets and/or planar targets as desired.

Figure 6B:
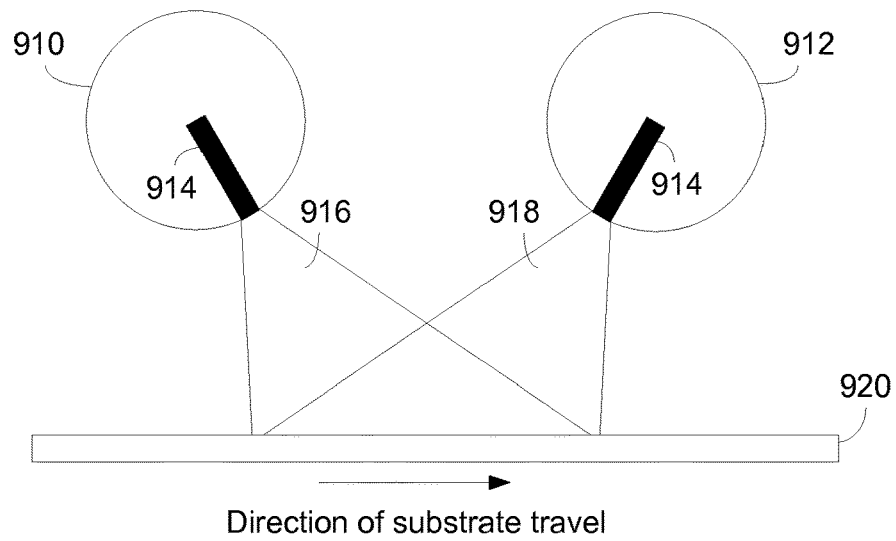
FIG. 6B shows a top-down view of two rotating sputter targets depositing material on a substrate according to certain embodiments.

In one example, two rotating targets are used to deposit a NiWTaO anodically coloring EC layer: a first target including nickel and tungsten, and a second target including tantalum (either or both optionally in oxide form). FIG. 6B presents a top down view of a deposition system for depositing an anodically coloring layer in this manner. The nickel tungsten target 910 and the tantalum target 912 each include an interior magnet 914. The magnets 914 are angled toward one another such that the sputter cones 916 and 918 from the nickel tungsten target 910 and tantalum target 912, respectively, overlap. FIG. 6B also shows a substrate 920 passing in front of the targets 910 and 912. As shown, the sputter cones 916 and 918 closely overlap where they impact the substrate 920. In some embodiments, the sputter cones from various sputter targets may closely overlap with one another (e.g., the non-overlapping area over which only a single sputter cone reaches when depositing on a substrate is less than about 10%, for example less than about 5% of the total area over which either sputter cone reaches). In other embodiments, the sputter cones may diverge from one another to a greater degree such that either or both of the sputter cones has a non-overlapping area that is at least about 10%, for example at least about 20%, or at least about 30%, or at least about 50%, of the total area over which either sputter cone reaches.

In a similar embodiment to the one shown in FIG. 6B, one sputter target is tungsten and the other is an alloy of nickel and tantalum (either or both targets optionally being in oxide form). Similarly, one sputter target may be nickel and the other may be an alloy of tungsten and tantalum (either or both target optionally being in oxide form). In a related embodiment, three sputter targets are used: a tantalum target, a nickel target, and a tungsten target (any of which can optionally be in oxide form). The sputter cones from each of the three targets may overlap by angling the magnets as appropriate. Also, shielding, gratings and/or other additional plasma shaping elements may be used to aid in creating the appropriate plasma mixture to form the NiWTaO.

Various sputter target designs, orientations, and implementations are further discussed in U.S. patent application Ser. No. 13/462,725, filed May 2, 2012, and titled "ELECTROCHROMIC DEVICES," which is herein incorporated by reference in its entirety.

The density and orientation/shape of material that sputters off of a sputter target depends on various factors including, for example, the magnetic field shape and strength, pressure, and power density used to generate the sputter plasma. The distance between adjacent targets, as well as the distance between each target and substrate, can also affect how the sputter plasmas will mix and how the resulting material is deposited on the substrate.

In certain embodiments, two different types of sputter targets are provided to deposit a single layer in an electrochromic stack: (a) primary sputter targets, which sputter material onto a substrate, and (b) secondary sputter targets, which sputter material onto the primary sputter targets. The primary and secondary sputter targets may include any combination of metal, metal alloys, and metal oxides that achieve a desired composition in a deposited layer. In one particular example, a primary sputter target includes an alloy of nickel and tungsten, and a secondary sputter target includes tantalum. In another example a primary sputter target includes tantalum and a secondary sputter target includes an alloy of nickel and tungsten. These sputter targets may be used together to deposit an anodically coloring layer of NiWTaO. Other combinations of alloys (e.g., nickel-tantalum, tungsten-tantalum) and metals (e.g., nickel, tungsten) can also be used. Any sputter target may be provided as an oxide.

Figure 7A:
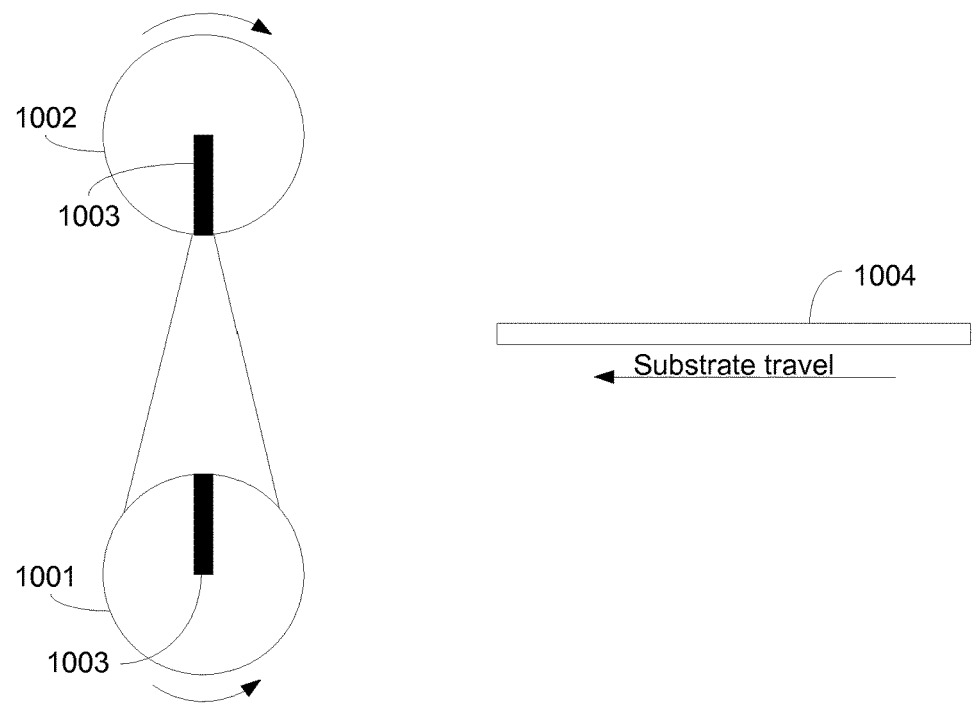
FIGS. 7A-7C relate to embodiments where a secondary sputter target is used to deposit material onto a primary sputter target, which then deposits on a substrate according to certain embodiments.
Figure 7B:
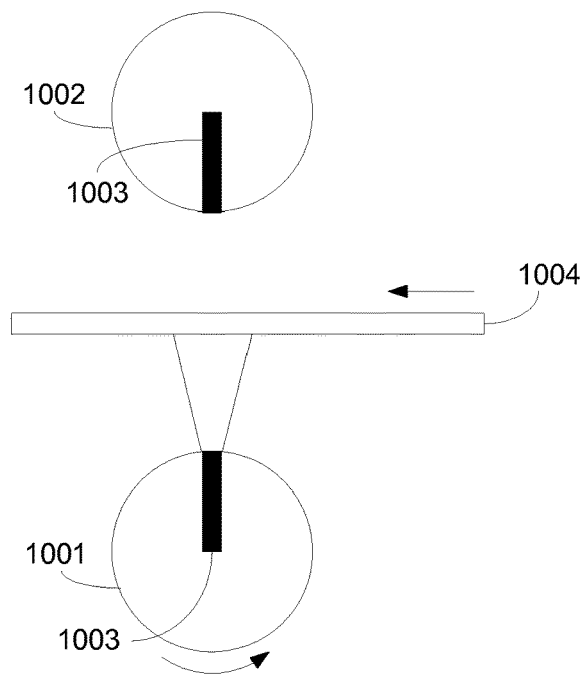

A number of different setups are possible when using both primary and secondary sputter targets. FIGS. 7A and 7B presents top-down views of one embodiment of a deposition station for depositing a NiWTaO anodically coloring counter electrode layer. Though presented in the specific context of depositing NiWTaO, the sputter target configurations discussed herein may be used to deposit any material in the electrochromic stack, provided that the targets are of appropriate compositions to deposit the desired material in the stack. A primary sputter target 1001 and a secondary sputter target 1002 are provided, each with an internal magnet 1003. Each sputter target in this example is a rotating sputter target, though planar or other shaped targets may be used as well. The targets may rotate in the same direction or in opposite directions. The secondary sputter target 1002 sputters material onto the primary sputter target 1001 when no substrate 1004 is present between the two targets, as shown in FIG. 7A. This deposits material from the secondary sputter target 1002 onto the primary sputter target 1001. Then, as the substrate 1004 moves into position between the two targets, sputtering from the secondary sputter target 1002 ceases and sputtering from the primary sputter target 1001 onto the substrate 1004 begins, as shown in FIG. 7B.

When material is sputtered off of the primary sputter target 1001 and deposited onto the substrate 1004, the deposited material includes material that originated from both the primary and secondary sputter targets 1001 and 1002, respectively. In effect, this method involves in-situ formation of an intermixed sputter target surface on the primary sputter target 1001. One advantage of this method is that a fresh coating of material from the secondary sputter target 1002 (e.g., in some cases this material is tantalum, tungsten, nickel, or combinations and/or alloys thereof) is periodically deposited on the surface of the primary sputter target 1001. The intermixed materials are then delivered together to the substrate 1004.

Figure 7C:
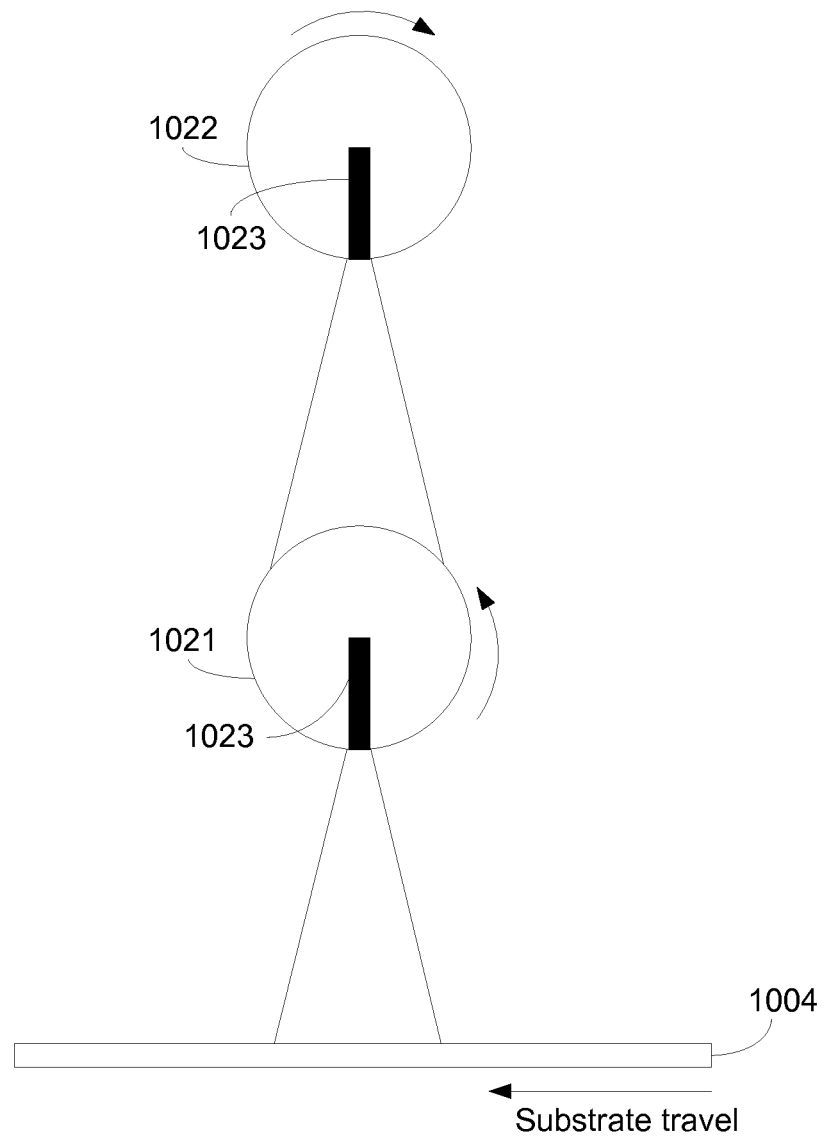

In a related embodiment shown in FIG. 7C, a secondary sputter target 1022 is positioned behind a primary sputter target 1021, and a substrate 1024 passes in front of the primary sputter target 1021 such that it does not block the line of sight between the two targets 1021 and 1022. Each of the sputter targets may include a magnet 1023. In this embodiment, there is no need to periodically stop sputtering from the secondary sputter target 1021 onto the primary sputter target 1022. Instead, such sputtering can occur continuously. Where the primary sputter target 1021 is located in between the substrate 1024 and the secondary sputter target 1022 (e.g., there is no line of sight between the secondary sputter target 1022 and the substrate 1024), the primary sputter target 1021 should rotate such that material that is deposited onto the primary sputter target 1021 can be sputtered onto the substrate 1024. There is more flexibility in the design of the secondary sputter target 1022. In a related embodiment, the secondary sputter target may be a planar or other non-rotating target. Where two rotating targets are used, the targets may rotate in the same direction or in opposite directions.

In similar embodiments, the secondary sputter target (e.g., the secondary target in FIGS. 7A-7C) may be replaced with another secondary material source. The secondary material source may provide material to the primary sputter target through means other than sputtering. In one example, the secondary material source provides evaporated material to the primary sputter target. The evaporated material may be any component of a layer being deposited. In various examples the evaporated material is an elemental metal or metal oxide. Particular examples of evaporated material include tantalum, tungsten, and nickel, which may be used to form a NiWTaO anodically coloring counter electrode material. In one embodiment, elemental tantalum is evaporated onto a primary sputter target including a mixture and/or alloy of nickel and tungsten. Where a secondary material source provides evaporated material, the secondary material source may be provided at any location relative to the primary sputter target and substrate. In some embodiments the secondary material source is provided such that it is behind and deposits primarily on the primary sputter target, much like the setup shown in FIG. 7C.

Where both a primary and a secondary sputter target are used, the secondary sputter target may be operated at a potential that is cathodic compared to the potential of the primary sputter target (which is already cathodic). Alternatively, the targets may be operated independently. Still further, regardless of relative target potentials, neutral species ejected from the secondary target will deposit on the primary target. Neutral atoms will be part of the flux, and they will deposit on a cathodic primary target regardless of relative potentials.

Figure 8:
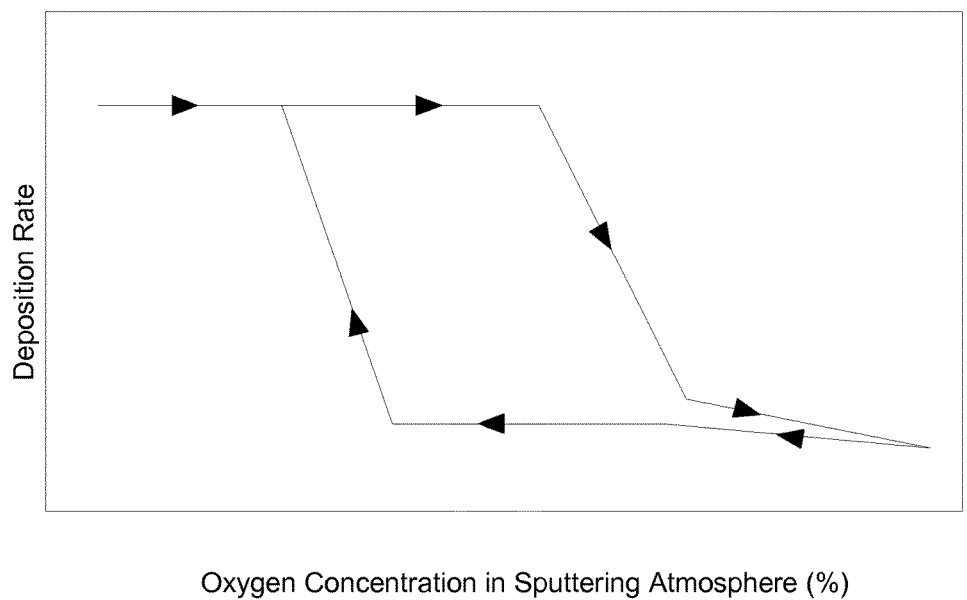
FIG. 8 illustrates a hysteresis curve for depositing various optically switchable materials.

In various embodiments, reactive sputtering may be used to deposit one or more materials in the electrochromic stack. FIG. 8 is a diagram showing the sputtering deposition rate from a sputter target as a function of oxygen concentration at a fixed power. As shown in FIG. 8, there is a strong hysteresis effect related to the oxygen concentration profile the target has been exposed to/operated under. For instance, when starting from a low oxygen concentration and increasing to a higher oxygen concentration, the deposition rate stays fairly high until the oxygen concentration reaches a point at which the sputter target forms an oxide that cannot be removed from the target sufficiently quickly. At this point the deposition rate drops down, and the sputter target essentially forms a metal oxide target. The deposition rate for an oxide target is generally much lower than the deposition rate for a metal target, all other conditions being equal. The relatively high deposition rate region in FIG. 8 corresponds to a metal deposition regime, while the relatively low deposition rate region corresponds to a metal oxide deposition regime. When the target is initially exposed to/operated under a high oxygen concentration then exposed to/operated under a relatively lower concentration, the deposition rate stays fairly low until the oxygen concentration reaches a point at which the deposition rate jumps up to a higher level. As shown in FIG. 8, the oxygen concentration at which these changes take place is different depending on whether the oxygen concentration is increasing or decreasing. The exact oxygen concentrations at which the regime changes occur can be controlled by changing the target power density and magnetic strength of the internal magnet 1003. For example, if one target is sputtering a substantially higher flux of metal atoms from the surface (due to higher power and/or magnetic strength), that target would likely stay in the metal deposition regime, compared to a target which is sputtering a very low flux of metal atoms. Such hysteresis effects can be used to advantage in a deposition process.

In certain embodiments where two or more sputter targets are used to deposit a material in the electrochromic stack, one target may be operated in the metal deposition regime and another target may be operated in the metal oxide deposition regime. By controlling the target power density, magnetic strength of the internal magnet 1003, and the atmosphere to which each target is exposed/operated under over time, it is possible to operate at both of these regimes simultaneously. In one example, a first nickel tungsten target is exposed to a relatively low concentration of oxygen and then brought to a mid-level concentration of oxygen such that it operates in the metal deposition regime. A second tantalum target is exposed to a relatively high concentration of oxygen and then brought to a mid-level concentration of oxygen such that it operates in the metal oxide deposition regime. The two targets can then be brought together, still exposed to the mid-level oxygen concentration, where they are used to deposit material onto a substrate under both regimes (the first target continuing to operate under the metal deposition regime and the second target continuing to operate under the metal oxide deposition regime).

The different atmosphere exposures for each target may not be needed in many cases. Other factors besides different historical oxygen exposure can result in the targets operating under the different deposition regimes. For instance, the targets may have different hysteresis curves due to the different material in the targets. As such, the targets may be able to operate under different regimes even if they are historically exposed to and operated under the same atmospheric oxygen conditions. Further, the amount of power applied to each target can significantly affect the deposition regime experienced by each target. In one example, therefore, one target is operated under a metal deposition regime and another target is operated under a metal oxide deposition regime due to the different powers applied to each target. This approach may be easier because it does not require separating the targets from one another such that they can be exposed to different oxygen concentrations. One advantage to operating the targets at different points in the hysteresis curves is that the composition of a deposited material can be closely controlled.

It should be understood that while the order of deposition operations is depicted in FIG. 4B (and implied in FIG. 2) to be first EC layer, second IC layer, and finally CE layer, the order can be reversed in various embodiments. In other words, when as described herein "sequential" deposition of the stack layers is recited, it is intended to cover the following "reverse" sequence, first CE layer, second IC layer, and third EC layer, as well the "forward" sequence described above. Both the forward and reverse sequences can function as reliable high-quality electrochromic devices. Further, it should be understood that conditions recited for depositing the various EC, IC, and CE materials recited here, are not limited to depositing such materials. Other materials may, in some cases, be deposited under the same or similar conditions. Moreover, the IC layer may be omitted in certain cases. Further, non-sputtering deposition conditions may be employed in some embodiments to create the same or similar deposited materials as those described in the context of FIG. 6 and FIG. 7.

Since the amount of charge each of the EC and the CE layers can safely hold varies, depending on the material used, the relative thickness of each of the layers may be controlled to match capacity as appropriate. In one embodiment, the electrochromic layer includes tungsten oxide and the counter electrode includes nickel tungsten tantalum oxide, and the ratio of thicknesses of the electrochromic layer to the counter electrode layer is between about 1.7:1 and 2.3:1, or between about 1.9:1 and 2.1:1 (with about 2:1 being a specific example).

Referring again to FIG. 4B, operation 720, after the CE layer is deposited, the EC stack is complete. It should be noted that in FIG. 4A, process operation 720, which refers to "depositing stack" means in this context, the EC stack plus the second TCO layer (sometimes referred to as the "ITO" when indium tin oxide is used to make the second TCO). Generally "stack" in this description refers to the EC-IC-CE layers; that is, the "EC stack." Referring again to FIG. 4B, in one embodiment, represented by process 728, a TCO layer is deposited on the stack. Referring to FIG. 2, this would correspond to second TCO layer 630 on EC stack 625. Process flow 720 is finished once process 728 is complete. Typically, but not necessarily, a capping layer is deposited on the EC stack. In some embodiments, the capping layer is SiAlO, similar to the IC layer. Particular deposition conditions for forming a second TCO layer are further discussed in U.S. patent application Ser. No. 12/645,111, which is incorporated by reference above.

As mentioned, the EC stack is fabricated in an integrated deposition system where the substrate does not leave the integrated deposition system at any time during fabrication of the stack. In one embodiment, the second TCO layer is also formed using the integrated deposition system where the substrate does not leave the integrated deposition system during deposition of the EC stack and the TCO layer. In one embodiment, all of the layers are deposited in the integrated deposition system where the substrate does not leave the integrated deposition system during deposition; that is, in one embodiment the substrate is a glass sheet and a stack including the EC layer, the IC layer and the CE layer, sandwiched between a first and a second TCO layer, is fabricated on the glass where the glass does not leave the integrated deposition system during deposition. In another implementation of this embodiment, the substrate is glass with a diffusion barrier deposited prior to entry in the integrated deposition system. In another implementation the substrate is glass and the diffusion barrier, a stack including the EC layer, the IC layer and the CE layer, sandwiched between a first and a second TCO layer, are all deposited on the glass where the glass does not leave the integrated deposition system during deposition.

While not wishing to be bound by theory, it is believed that prior art electrochromic devices suffered from high defectivity for various reasons, one of which is the integration of unacceptably high numbers of particles into the IC layer during fabrication. Care was not taken to ensure that each of the EC layer, IC layer, and CE layer were deposited in a single integrated deposition apparatus under a controlled ambient environment. In one process, the IC layer is deposited by a sol gel process, which is necessarily performed apart from other vacuum integrated processes. In such process, even if the EC layer and/or the CE layer are deposited in a controlled ambient environment, thereby promoting high quality layers, the substrate would have to be removed from the controlled ambient environment to deposit the IC layer. This would normally involve passing the substrate through a load lock (from vacuum or other controlled ambient environment to an external environment) prior to formation of the IC layer. Passage through a load lock typically introduces numerous particles onto the substrate. Introducing such particles immediately before the IC layer is deposited greatly increases the likelihood that defects will form in the critical IC layer. Such defects lead to bright spots or constellations as discussed above.

As mentioned above, lithium may be provided with the EC, CE and/or IC layers as they are formed on the substrate. This may involve, for example, co-sputtering of lithium together with the other materials of a given layer (e.g., tungsten and oxygen). In certain embodiments described below the lithium is delivered via a separate process and allowed to diffuse or otherwise incorporate into the EC, CE and/or IC layers. In some embodiments, only a single layer in the electrochromic stack is lithiated. For example, only the anodically coloring CE layer is lithiated in some examples. In other cases, only the cathodically coloring EC layer is lithiated. In still other cases, only the IC layer is lithiated.

In some embodiments, the electrochromic stack includes a counter electrode layer in direct physical contact with an electrochromic layer, without an ion conducting layer in between. The electrochromic and/or counter electrode layer may include an oxygen-rich portion in contact with the other of these layers. The oxygen-rich portion includes the electrochromic material or counter electrode material, with a higher concentration of oxygen than in the remaining portion of the electrochromic layer and/or counter electrode layer. Electrochromic devices fabricated according to such a design are further discussed and described in U.S. Pat. No. 8,300,298, filed Apr. 30, 2010, which is incorporated by reference above.

In certain embodiments, fabrication of the electrochromic stack occurs in an integrated deposition system. Such an integrated system may allow for deposition of the various layers in the stack without breaking vacuum. In other cases, one or more layers in the stack may be deposited by a process that requires removal from a protected vacuum environment. For example, in some cases one or more layers (e.g., a cathodically coloring EC layer) is deposited on a substrate under vacuum using physical vapor deposition, then the substrate is removed from vacuum and an ion conductor layer is deposited using a sol-gel (or other non-vacuum) process, and then the substrate is returned to a vacuum environment for deposition of the anodically coloring counter electrode layer. Sol-gel processes involve producing solid materials from small molecules. Monomers are converted into a colloidal solution that acts as the precursor for an integrated network of discrete particles or network polymers. Examples of ion conductor materials that may be deposited include, for example, silicate-based structures, lithium silicate, lithium aluminum silicate, lithium aluminum borate, lithium borate, lithium Zirconium silicate, lithium niobate, lithium borosilicate, lithium phosphosilicate, lithium nitride, lithium aluminum fluoride, and other such lithium-based ceramic materials, silicas, or silicon oxides, silicon dioxide, and tantalum oxide.

Direct Lithiation of the Electrochromic Stack

In some embodiments, as mentioned above, intercalation of lithium ions is responsible for switching the optical state of an electrochromic device stack. It should be understood that the needed lithium may be introduced to the stack by various means. For example, lithium may be provided to one or more of these layers concurrently with the deposition of the material of the layer (e.g., concurrent deposition of lithium and tungsten oxide during formation of the EC layer). In some cases, however, the process of FIG. 4B may be punctuated with one or more operations for delivering lithium to the EC layer, the IC layer, and/or the CE layer. For example, lithium may also be introduced via one or more separate lithiation steps in which elemental lithium is delivered without substantial deposition of other material. Such lithiation step(s) may take place after deposition of the EC layer, the IC layer, and/or the CE layer. Alternatively (or in addition), one or more lithiation steps may take intermediate between steps performed to deposit a single layer. For example, a counter electrode layer may be deposited by first depositing a limited amount of nickel tungsten tantalum oxide, followed by directly depositing lithium, and then concluded by depositing additional amounts of nickel tungsten tantalum oxide. Such approaches may have certain advantages such as better separating the lithium from the ITO (or other material of a conductive layer) which improves adhesion and prevents undesirable side reactions. One example of a stack formation process employing a separate lithiation operation is presented in FIG. 4C. In certain cases, the lithiation operation(s) takes place while the deposition of a given layer is temporarily halted to allow lithium to be introduced before deposition of the layer is completed.

FIG. 4C depicts a process flow, 720a, for depositing the stack onto a substrate in a manner analogous to process 720 of FIG. 4A. Process flow 720a includes depositing an EC layer, operation 722, depositing an IC layer, operation 724, and depositing a CE layer, operation 726, as described in relation to FIG. 4B. However, process flow 720a differs from 720 by the addition of lithiation operations 723 and 727. In one embodiment, the lithium is physical vapor deposited using an integrated deposition system where the substrate does not leave the integrated deposition system at any time during the sequential deposition of the electrochromic layer, the ion conducting layer, the counter electrode layer, and the lithium. Particular conditions for lithiation are further discussed in U.S. patent application Ser. No. 12/645,111, which is incorporated by reference above.

In one embodiment of the dual lithiation method, as explained above, the EC layer is treated with sufficient lithium to satisfy the requirements of the EC material irreversibly bound lithium (to, e.g., compensate "blind charge"). The lithium needed for reversible cycling is added to the CE layer (which also may have a blind charge). In certain embodiments, the lithium needed to compensate the blind charge can be titrated by monitoring optical density of the EC layer as lithium is added since the EC layer will not substantially change color until sufficient lithium has been added to fully compensate the blind charge.

One of ordinary skill in the art would appreciate that because metallic lithium is pyrophoric, i.e., highly reactive with moisture and oxygen, that lithiation methods described herein where lithium might be exposed to oxygen or moisture are performed either under vacuum, inert atmosphere or both. The controlled ambient environment of apparatus and methods provides flexibility in lithium depositions, particularly where there are multiple lithiation steps. For example, where lithiation is performed in a titration process and/or among multiple steps in a stack layering, the lithium can be protected from exposure to oxygen or moisture.

In certain embodiments, the lithiation is performed at a rate sufficient to prevent formation of a substantial thickness of free lithium on the EC layer surface. In one embodiment, during lithiation of the EC layer, lithium targets are spaced sufficiently to give time for lithium to diffuse into the EC layer. Optionally, the substrate (and hence the EC layer) is heated to between about 100° C. and about 150° C. to enhance diffusion of lithium into the EC layer. Heating may be done separately or in combination with target spacing and substrate translation past the target(s). In some cases, the substrate is moved back and forth in front of a sputtered lithium target in order to slow the delivery of lithium to the substrate and prevent accumulation of free metallic lithium on the stack surface. Isolation protocols may be used for performing lithiation. Such protocols are further discussed in U.S. patent application Ser. No. 12/645,111, which is incorporated by reference above.

FIG. 4D depicts another process flow, 720b, for depositing the stack onto a substrate. The process is analogous to process flow 700 of FIG. 4A. Process flow 720b includes depositing an EC layer (operation 722) depositing an IC layer (operation 724) and depositing a CE layer (operation 726) as described in relation to FIG. 4B. However, process flow 720b differs from 720 because there is an intervening lithiation operation 727. In this embodiment of the process of stack deposition, all the required lithium is added by delivering lithium to the CE layer and allowing the lithium to intercalate into the EC layer via diffusion through the IC layer during and/or after stack fabrication.

Multistep Thermochemical Conditioning

Referring again to FIG. 4A, once the stack is deposited, the device is subjected to a multistep thermo-chemical conditioning (MTC) process (see block 730). Typically, the MTC process is performed only after all layers of the electrochromic stack have been formed. Some embodiments of the MTC process 730 are depicted in more detail in FIG. 4E. Note that the MTC process can be conducted entirely ex situ, i.e., outside of the integrated deposition system used to deposit the stack, or at least partially or wholly in situ, i.e., inside the deposition system without e.g. breaking vacuum or otherwise moving the substrate outside the controlled ambient environment used to fabricate the stack. In certain embodiments, the initial portions of the MTC process are performed in situ, and later portions of the process are performed ex situ. In certain embodiments, portions of the MTC are performed prior to deposition of certain layers, for example, prior to deposition of the second TCO layer.

Referring to FIG. 4E, and in accordance with certain embodiments, the device is first thermally treated under non-reactive conditions (e.g., under an inert gas). See block 732. Next, the device is subjected to a thermal treatment under reactive conditions. See block 734. Particular conditions for performing the thermal treatments are further discussed in U.S. patent application Ser. No. 12/645,111, which is incorporated by reference above.

As mentioned above, additional layers may be needed for improved optical performance (e.g. anti-reflectives), durability (due to physical handling), hermeticity, and the like. Addition of one or more of these layers is meant to be included in additional embodiments to those described above.

The lithiation and high temperature processing operations described herein can affect the composition and structure of various materials in the electrochromic stack. As one example, where an electrochromic stack includes a cathodically coloring EC layer in direct contact with an anodically coloring CE layer (with no separate ion conducting layer deposited in between them), the thermal processing operations can change the composition and/or structure of the cathodically coloring EC and anodically coloring CE layers at an interfacial region between these layers, to thereby form a region that has ion conducting, electronically insulating properties. Similarly, lithiation and thermal processing operations can affect the composition and structure of an anodically coloring counter electrode layer. In various cases an anodically coloring counter electrode layer is improved through such operations.

Fabrication Process for Completion of the Device

Again referring to FIG. 4A, a second laser scribe (block 740) is performed. Laser scribe 740 is performed across the length of the substrate near the outer edge of the stack, on the two sides of the substrate perpendicular to the first laser scribe. FIG. 3 shows the location of the trenches, 626, formed by laser scribe 740. This scribe is also performed all the way through the first TCO (and diffusion barrier if present) to the substrate in order to further isolate the isolated portion of the first TCO layer (where the first bus bar will be connected) and to isolate the stack coating at the edges (e.g. near a mask) to minimize short circuits due to deposition roll off of the stack layers. In one embodiment, the trench is between about 100 µm and 300 µm wide. In another embodiment, the trench is between about 150 µm and 250 µm wide. In another embodiment, the trench is about 150 µm wide. The trench should be deep enough to effectively isolate the relevant components.

Next, a third laser scribe, 745, is performed along the perimeter of the stack near the edge of the substrate opposite the first laser scribe and parallel to the first laser scribe. This third laser scribe is only deep enough to isolate the second TCO layer and the EC stack, but not cut through the first TCO layer. Referring to FIG. 2, laser scribe 745 forms a trench, 635, which isolates the uniform conformal portions EC stack and second TCO from the outermost edge portions which can suffer from roll off (e.g. as depicted in FIG. 2, the portion of layers 625 and 630 near area 650 isolated by cutting trench 635) and thus cause shorts between the first and second TCO layers in region 650 near where the second bus bar will be attached. Trench 635 also isolates roll off regions of the second TCO from the second bus bar. Trench 635 is also depicted in FIG. 3. One of ordinary skill in the art would appreciate that laser scribes 2 and 3, although scribed at different depths, could be done in a single process whereby the laser cutting depth is varied during a continuous path around the three sides of the substrate as described. First at a depth sufficient to cut past the first TCO (and optionally the diffusion barrier) along a first side perpendicular to the first laser scribe, then at a depth sufficient only to cut through to the bottom of the EC stack along the side opposite and parallel to the first laser scribe, and then again at the first depth along the third side, perpendicular to the first laser scribe.

Referring again to process 700, in FIG. 4A, after the third laser scribe, the bus bars are attached, process 750. Referring to FIG. 2, bus bar 1, 640, and bus bar 2, 645, are attached. Bus bar 1 is often pressed through the second TCO and EC stack to make contact with the second TCO layer, for example via ultrasonic soldering. This connection method necessitates the laser scribe processes used to isolate the region of the first TCO where bus bar 1 makes contact. Those of ordinary skill in the art will appreciate that other means of connecting bus bar 1 (or replacing a more conventional bus bar) with the second TCO layer are possible, e.g., screen and lithography patterning methods. In one embodiment, electrical communication is established with the device's transparent conducting layers via silk screening (or using another patterning method) a conductive ink followed by heat curing or sintering the ink. When such methods are used, isolation of a portion of the first TCO layer is avoided. By using process flow 700, an electrochromic device is formed on a glass substrate where the first bus bar is in electrical communication with second TCO layer 630 and the second bus bar is in electrical contact with first TCO layer 615. In this way, the first and second TCO layers serve as electrodes for the EC stack.

Referring again to FIG. 4A, after the bus bars are connected, the device is integrated into an IGU, process 755. The IGU is formed by placing a gasket or seal (e.g. made of PVB (polyvinyl butyral), PIB or other suitable elastomer) around the perimeter of the substrate. Typically, but not necessarily, a desiccant is included in the IGU frame or spacer bar during assembly to absorb any moisture. In one embodiment, the seal surrounds the bus bars and electrical leads to the bus bars extend through the seal. After the seal is in place, a second sheet of glass is placed on the seal and the volume produced by the substrate, the second sheet of glass and the seal is filled with inert gas, typically argon. Once the IGU is complete, process 700 is complete. The completed IGU can be installed in, for example, a pane, frame or curtain wall and connected to a source of electricity and a controller to operate the electrochromic window.

In addition to the process steps described in relation to the methods above, an edge deletion step or steps may be added to the process flow. Edge deletion is part of a manufacturing process for integrating the electrochromic device into, e.g. a window, where the roll off (as described in relation to FIG. 2) is removed prior to integration of the device into the window. Where unmasked glass is used, removal of the coating that would otherwise extend to underneath the IGU frame (undesirable for long term reliability) is removed prior to integration into the IGU. This edge deletion process is meant to be included in the methods above as an alternative embodiment to those listed above.

In certain embodiments, a different process flow may be used to fabricate an electrochromic device. Alternative process flows are further discussed in U.S. patent application Ser. No. 14/362,863, filed Jun. 4, 2014, and titled "THIN-FILM DEVICES AND FABRICATION," and in U.S. patent application Ser. No. 13/763,505, filed Feb. 8, 2013, and titled "DEFECT-MITIGATION LAYERS IN ELECTROCHROMIC DEVICES," which are each herein incorporated by reference in their entireties.

Integrated Deposition System

As explained above, an integrated deposition system may be employed to fabricate electrochromic devices on, for example, architectural glass. As described above, the electrochromic devices are used to make IGUs which in turn are used to make electrochromic windows. The term "integrated deposition system" means an apparatus for fabricating electrochromic devices on optically transparent and translucent substrates. The apparatus has multiple stations, each devoted to a particular unit operation such as depositing a particular component (or portion of a component) of an electrochromic device, as well as cleaning, etching, and temperature control of such device or portion thereof. The multiple stations are fully integrated such that a substrate on which an electrochromic device is being fabricated can pass from one station to the next without being exposed to an external environment. Integrated deposition systems operate with a controlled ambient environment inside the system where the process stations are located. A fully integrated system allows for better control of interfacial quality between the layers deposited. Interfacial quality refers to, among other factors, the quality of the adhesion between layers and the lack of contaminants in the interfacial region. The term "controlled ambient environment" means a sealed environment separate from an external environment such as an open atmospheric environment or a clean room. In a controlled ambient environment at least one of pressure and gas composition is controlled independently of the conditions in the external environment. Generally, though not necessarily, a controlled ambient environment has a pressure below atmospheric pressure; e.g., at least a partial vacuum. The conditions in a controlled ambient environment may remain constant during a processing operation or may vary over time. For example, a layer of an electrochromic device may be deposited under vacuum in a controlled ambient environment and at the conclusion of the deposition operation, the environment may be backfilled with purge or reagent gas and the pressure increased to, e.g., atmospheric pressure for processing at another station, and then a vacuum reestablished for the next operation and so forth.

In one embodiment, the system includes a plurality of deposition stations aligned in series and interconnected and operable to pass a substrate from one station to the next without exposing the substrate to an external environment. The plurality of deposition stations comprise (i) a first deposition station containing one or more targets for depositing a cathodically coloring electrochromic layer; (ii) a second deposition station containing one or more targets for depositing an ion conducting layer; and (iii) a third deposition station containing one or more targets for depositing a counter electrode layer. The second deposition station may be omitted in certain cases. For instance, the apparatus may not include any target for depositing a separate ion conductor layer. The system also includes a controller containing program instructions for passing the substrate through the plurality of stations in a manner that sequentially deposits on the substrate (i) an electrochromic layer, (ii) an (optional) ion conducting layer, and (iii) a counter electrode layer to form a stack. In cases where the counter electrode layer includes two or more sub-layers, the sub-layers may be formed in different stations or in the same station, depending on the desired composition of each sub-layer, among other factors. In one example, a first station may be used to deposit the cathodically coloring electrochromic layer, a second station may be used to deposit a first sub-layer of an anodically coloring counter electrode layer, and a third station may be used to deposit a second sub-layer of the anodically coloring counter electrode layer.

In one embodiment, the plurality of deposition stations are operable to pass a substrate from one station to the next without breaking vacuum. In another embodiment, the plurality of deposition stations are configured to deposit the electrochromic layer, the optional ion conducting layer, and the counter electrode layer on an architectural glass substrate. In another embodiment, the integrated deposition system includes a substrate holder and transport mechanism operable to hold the architectural glass substrate in a vertical orientation while in the plurality of deposition stations. In yet another embodiment, the integrated deposition system includes one or more load locks for passing the substrate between an external environment and the integrated deposition system. In another embodiment, the plurality of deposition stations include at least two stations for depositing a layer selected from the group consisting of the cathodically coloring electrochromic layer, the ion conducting layer, and the anodically coloring counter electrode layer.

In some embodiments, the integrated deposition system includes one or more lithium deposition stations, each including a lithium containing target. In one embodiment, the integrated deposition system contains two or more lithium deposition stations. In one embodiment, the integrated deposition system has one or more isolation valves for isolating individual process stations from each other during operation. In one embodiment, the one or more lithium deposition stations have isolation valves. In this document, the term "isolation valves" means devices to isolate depositions or other processes being carried out one station from processes at other stations in the integrated deposition system. In one example, isolation valves are physical (solid) isolation valves within the integrated deposition system that engage while the lithium is deposited. Actual physical solid valves may engage to totally or partially isolate (or shield) the lithium deposition from other processes or stations in the integrated deposition system. In another embodiment, the isolation valves may be gas knifes or shields, e.g., a partial pressure of argon or other inert gas is passed over areas between the lithium deposition station and other stations to block ion flow to the other stations. In another example, isolation valves may be an evacuated regions between the lithium deposition station and other process stations, so that lithium ions or ions from other stations entering the evacuated region are removed to, e.g., a waste stream rather than contaminating adjoining processes. This is achieved, e.g., via a flow dynamic in the controlled ambient environment via differential pressures in a lithiation station of the integrated deposition system such that the lithium deposition is sufficiently isolated from other processes in the integrated deposition system. Again, isolation valves are not limited to lithium deposition stations.

Figures 5A, 5C:
FIG. 5A, depicts an integrated deposition system according to certain embodiments.
FIG. 5C depicts a modular integrated deposition system.

FIG. 5A, depicts in schematic fashion an integrated deposition system 800 in accordance with certain embodiments. In this example, system 800 includes an entry load lock, 802, for introducing the substrate to the system, and an exit load lock, 804, for removal of the substrate from the system. The load locks allow substrates to be introduced and removed from the system without disturbing the controlled ambient environment of the system. Integrated deposition system 800 has a module, 806, with a plurality of deposition stations; an EC layer deposition station, an IC layer deposition station and a CE layer deposition station. In the broadest sense, integrated deposition systems need not have load locks, e.g. module 806 could alone serve as the integrated deposition system. For example, the substrate may be loaded into module 806, the controlled ambient environment established and then the substrate processed through various stations within the system. Individual stations within an integrated deposition systems can contain heaters, coolers, various sputter targets and means to move them, RF and/or DC power sources and power delivery mechanisms, etching tools e.g. plasma etch, gas sources, vacuum sources, glow discharge sources, process parameter monitors and sensors, robotics, power supplies, and the like.

Figure 5B:
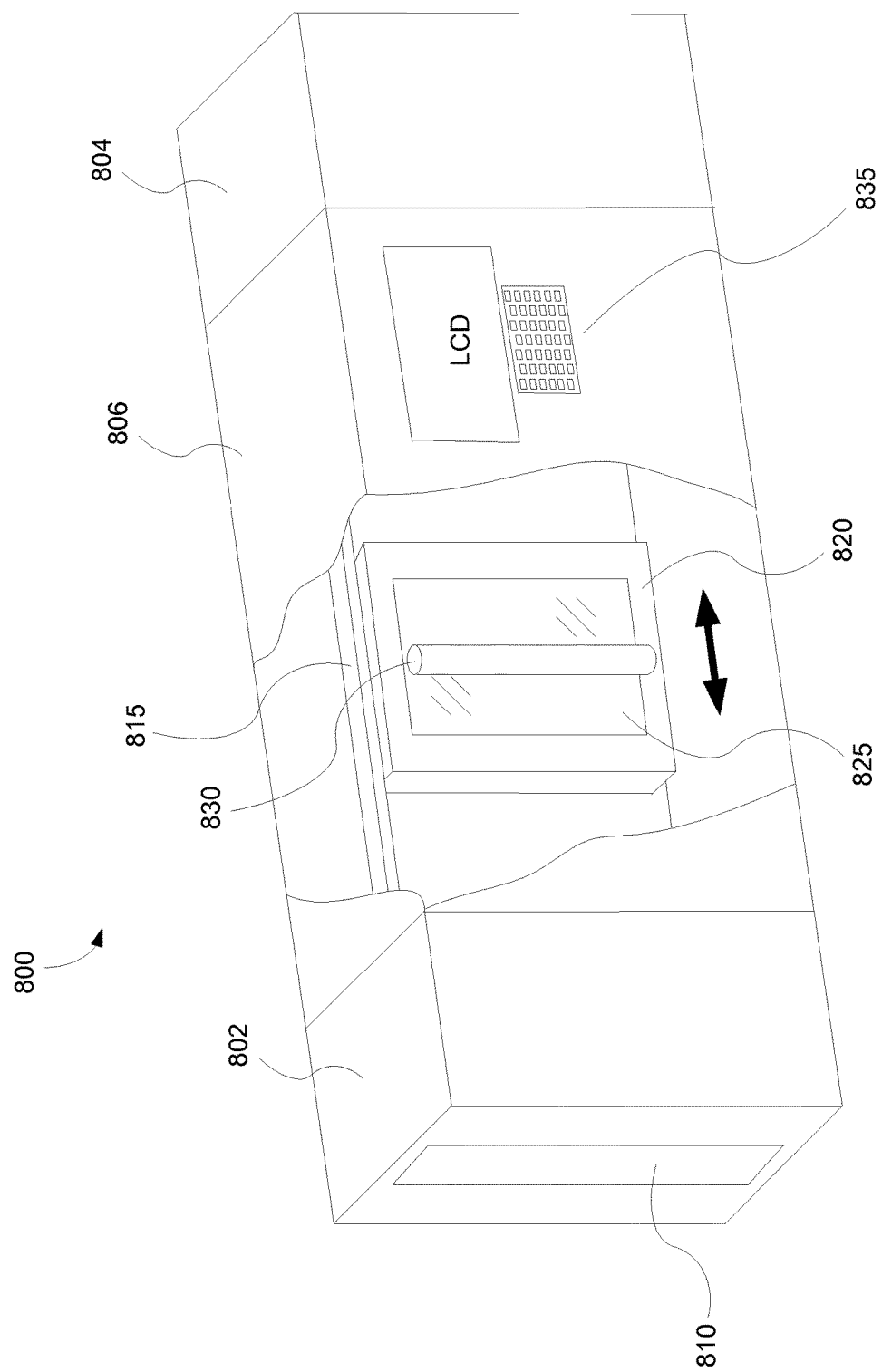
FIG. 5B depicts an integrated deposition system in a perspective view.

FIG. 5B depicts a segment (or simplified version) of integrated deposition system 800 in a perspective view and with more detail including a cutaway view of the interior. In this example, system 800 is modular, where entry load lock 802 and exit load lock 804 are connected to deposition module 806. There is an entry port, 810, for loading, for example, architectural glass substrate 825 (load lock 804 has a corresponding exit port). Substrate 825 is supported by a pallet, 820, which travels along a track, 815. In this example, pallet 820 is supported by track 815 via hanging but pallet 820 could also be supported atop a track located near the bottom of apparatus 800 or a track, e.g. mid-way between top and bottom of apparatus 800. Pallet 820 can translate (as indicated by the double headed arrow) forward and/or backward through system 800. For example during lithium deposition, the substrate may be moved forward and backward in front of a lithium target, 830, making multiple passes in order to achieve a desired lithiation. Pallet 820 and substrate 825 are in a substantially vertical orientation. A substantially vertical orientation is not limiting, but it may help to prevent defects because particulate matter that may be generated, e.g., from agglomeration of atoms from sputtering, will tend to succumb to gravity and therefore not deposit on substrate 825. Also, because architectural glass substrates tend to be large, a vertical orientation of the substrate as it traverses the stations of the integrated deposition system enables coating of thinner glass substrates since there are less concerns over sag that occurs with thicker hot glass.

Target 830, in this case a cylindrical target, is oriented substantially parallel to and in front of the substrate surface where deposition is to take place (for convenience, other sputter means are not depicted here). Substrate 825 can translate past target 830 during deposition and/or target 830 can move in front of substrate 825. The movement path of target 830 is not limited to translation along the path of substrate 825. Target 830 may rotate along an axis through its length, translate along the path of the substrate (forward and/or backward), translate along a path perpendicular to the path of the substrate, move in a circular path in a plane parallel to substrate 825, etc. Target 830 need not be cylindrical, it can be planar or any shape necessary for deposition of the desired layer with the desired properties. Also, there may be more than one target in each deposition station and/or targets may move from station to station depending on the desired process.

Integrated deposition system 800 also has various vacuum pumps, gas inlets, pressure sensors and the like that establish and maintain a controlled ambient environment within the system. These components are not shown, but rather would be appreciated by one of ordinary skill in the art. System 800 is controlled, e.g., via a computer system or other controller, represented in FIG. 5B by an LCD and keyboard, 835. One of ordinary skill in the art would appreciate that embodiments herein may employ various processes involving data stored in or transferred through one or more computer systems. Embodiments also relate to the apparatus, such computers and microcontrollers, for performing these operations. These apparatus and processes may be employed to deposit electrochromic materials of methods herein and apparatus designed to implement them. The control apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform and/or control the required method and processes.

As mentioned, the various stations of an integrated deposition system may be modular, but once connected, form a continuous system where a controlled ambient environment is established and maintained in order to process substrates at the various stations within the system. FIG. 5C depicts integrated deposition system 800a, which is like system 800, but in this example each of the stations is modular, specifically, an EC layer station 806a, an IC layer station 806b and a CE layer station 806c. In a similar embodiment, the IC layer station 806b is omitted. Modular form is not necessary, but it is convenient, because depending on the need, an integrated deposition system can be assembled according to custom needs and emerging process advancements. For example, FIG. 5D depicts an integrated deposition system, 800b, with two lithium deposition stations, 807a and 807b. System 800b is, e.g., equipped to carry out methods herein as described above, such as the dual lithiation method described in conjunction with FIG. 4C. System 800b could also be used to carry out a single lithiation method, e.g., that described in conjunction with FIG. 4D, for example by only utilizing lithium station 807b during processing of the substrate. But with modular format, e.g. if single lithiation is the desired process, then one of the lithiation stations is redundant and system 800c, as depicted in FIG. 5E can be used. System 800c has only one lithium deposition station, 807.

Systems 800b and 800c also have a TCO layer station, 808, for depositing the TCO layer on the EC stack. Depending on the process demands, additional stations can be added to the integrated deposition system, e.g., stations for cleaning processes, laser scribes, capping layers, MTC, etc.

Although the foregoing embodiments have been described in some detail to facilitate understanding, the described embodiments are to be considered illustrative and not limiting. It will be apparent to one of ordinary skill in the art that certain changes and modifications can be practiced within the scope of the appended claims.

Experimental Results

Experimental results show that the disclosed NiWTaO materials exhibit very high quality coloring characteristics. In particular, the NiWTaO materials are very clear (transparent) in their untinted state, having less color (particularly yellow color) as compared to other materials that are somewhat colored in their untinted states. Further, the NiWTaO materials show good switching characteristics over time. In other words, the switching speed does not significantly decrease over the life of the counter electrode, as compared to certain other materials that exhibit increasingly slow switching speeds.

NiWTaO Deposition

Mixed nickel tungsten tantalum oxide, NiWTaO, may be deposited using repeated deposition of very thin layers of sputtered material as the substrate is rastered back-and-forth in a deposition chamber. Reactive sputtering of NiW alloy and tantalum metal targets in a mixture of argon and molecular oxygen with a chamber pressure of approximately 10 mTorr may be used. The NiW alloy target may be produced using a Hot Isostatic Press (HIP) method using Ni and W powders. The power to each target is independently controlled using two synchronized pulsed DC power supplies. The ratio of Ta to Ni+W is adjusted by varying the power ratio between the two targets. The thickness of the NiWTaO for a given set of power conditions can be changed by increasing or decreasing the speed of the substrate as it moves through the deposition chamber. In order to achieve the desired thickness of the entire counter-electrode, the number of passes in front of the targets can be increased or decreased as needed. The degree of oxidation of the film can be controlled by adjusting the partial pressures of Ar and $O_2$ in the sputtering gas, as well as the total pressure. Through the manipulation of these process parameters, the ratio of NiW:Ta:O can be controlled. Heaters may be used for temperature variation, but the highest-performance films and devices are typically deposited without additional heating. The substrate temperature is typically less than 100° C.

As an example, a high performance counter electrode may be achieved by sputtering in a pure oxygen environment with power and substrate speed settings chosen to achieve a thickness of less than 5 nm per pass. More than 150 passes through the deposition system can be performed in some cases to build film thickness. The power supplies for the two sputter targets may be chosen such that the NiW power (e.g., about 6 kW) is greater than (e.g., about 12× greater) the Ta power (e.g., about 0.5 kW). The resulting Ni:(W+Ta) ratio may be approximately 2:1.

OTHER EMBODIMENTS

Although the foregoing embodiments have been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. A method of fabricating an electrochromic stack, the method comprising:
    forming a cathodically coloring layer comprising a cathodically coloring electrochromic material; and
    forming an anodically coloring layer comprising nickel tungsten tantalum oxide.

2. The method of claim 1, wherein the nickel tungsten tantalum oxide has an atomic ratio of Ni:(W+Ta) that is between about 1.5:1 and 3:1.

3. The method of claim 2, wherein the atomic ratio of Ni:(W+Ta) in the nickel tungsten tantalum oxide is between about 1.5:1 and 2.5:1.

4. The method of claim 1, wherein the nickel tungsten tantalum oxide has an atomic ratio of W:Ta that is between about 1:1 and 2:1.

5. The method of claim 1, wherein forming the anodically coloring layer comprises sputtering one or more sputter targets each comprising at least one metal selected from the group consisting of nickel, tungsten, and tantalum to form the nickel tungsten tantalum oxide.

6. The method of claim 1, wherein the anodically coloring layer is substantially amorphous.

7. The method of claim 1, wherein the cathodically coloring layer and the anodically coloring layer are formed in direct physical contact with one another, without a separate ion conductor layer deposited between them, and further comprising converting a portion of the cathodically coloring layer and/or a portion of the anodically coloring layer to form an ion conducting and electrically insulating interfacial region between the cathodically coloring and anodically coloring layers.

8. The method of claim 1, wherein the anodically coloring layer comprises two or more sub-layers that have different compositions and/or morphologies.

9. The method of claim 1, wherein the cathodically coloring electrochromic material comprises tungsten oxide.

10. The method of claim 1, wherein the cathodically coloring layer comprises a bilayer or a graded layer, and wherein a portion of the cathodically coloring layer is superstoichiometric with respect to oxygen.

11. An electrochromic device stack, comprising:
    a cathodically coloring layer comprising a cathodically coloring material; and
    an anodically coloring layer comprising nickel tungsten tantalum oxide.

12. The electrochromic device stack of claim 11, wherein the nickel tungsten tantalum oxide has an atomic ratio of Ni:(W+Ta) that is between about 1.5:1 and 3:1.

13. The electrochromic device stack of claim 12, wherein the atomic ratio of Ni:(W+Ta) in the nickel tungsten tantalum oxide is between about 1.5:1 and 2.5:1.

14. The electrochromic device stack of claim 11, wherein the nickel tungsten tantalum oxide has an atomic ratio of W:Ta that is between about 1:1 and 2:1.

15. The electrochromic device stack of claim 11, wherein the anodically coloring layer is substantially amorphous.

16. The electrochromic device stack of claim 11, wherein the anodically coloring layer comprises two or more sublayers having different compositions and/or morphologies.

17. The electrochromic device stack of claim 11, wherein the cathodically coloring material comprises tungsten oxide.

18. The electrochromic device stack of claim 11, wherein the cathodically coloring layer comprises a bilayer or a graded layer, and wherein a portion of the cathodically coloring layer is superstoichiometric with respect to oxygen.

19. A composition of matter comprising:
(a) nickel;
(b) tungsten;
(c) tantalum; and
(d) oxygen,
wherein the composition comprises an atomic ratio of Ni:(W+Ta) that is between about 1.5:1 and 3:1, and an atomic ratio of W:Ta that is between about 0.1:1 and 6:1.

20. The composition of claim 19, wherein the atomic ratio of Ni:(W+Ta) is between about 1.5:1 and 2.5:1.

21. The composition of claim 19, wherein the atomic ratio of W:Ta is between about 1:1 and 2:1.

22. The composition of claim 19, wherein the composition is provided as an amorphous matrix with nanocrystals distributed throughout, wherein the nanocrystals have a mean diameter of about 50 nm or less.

* * * * *